(12) United States Patent
Kanatzidis et al.

(10) Patent No.: US 8,778,214 B2
(45) Date of Patent: Jul. 15, 2014

(54) THERMOELECTRICS COMPOSITIONS COMPRISING NANOSCALE INCLUSIONS IN A CHALCOGENIDE MATRIX

(75) Inventors: Mercouri G. Kanatzidis, Wilmette, IL (US); Qichun Zhang, Singapore (SG); Steven N. Girard, Chicago, IL (US); Kanishka Biswas, Evanston, IL (US)

(73) Assignee: Northwestern University, Evanston, IL (US)

( * ) Notice: Subject to any disclaimer, the term of this patent is extended or adjusted under 35 U.S.C. 154(b) by 585 days.

(21) Appl. No.: 12/882,580

(22) Filed: Sep. 15, 2010

(65) Prior Publication Data

US 2011/0073797 A1 Mar. 31, 2011

Related U.S. Application Data

(60) Provisional application No. 61/245,990, filed on Sep. 25, 2009, provisional application No. 61/246,309, filed on Sep. 28, 2009, provisional application No. 61/311,523, filed on Mar. 8, 2010.

(51) Int. Cl.
| | | |
|---|---|---|
| C04B 35/00 | (2006.01) | |
| H01L 29/12 | (2006.01) | |
| H01L 29/22 | (2006.01) | |
| H01L 35/14 | (2006.01) | |

(52) U.S. Cl.
USPC ..................................... 252/62.3 V; 136/239

(58) Field of Classification Search
USPC ........... 252/62.3 T, 62.3 ZT, 62.3 V; 136/238, 136/239
See application file for complete search history.

(56) References Cited

U.S. PATENT DOCUMENTS

| | | | |
|---|---|---|---|
| 2,811,440 A | 10/1957 | Fritts et al. | |
| 2,811,571 A | 10/1957 | Fritts et al. | |
| 2,811,720 A | 10/1957 | Fritts et al. | |
| 2,811,721 A | 10/1957 | Fritts et al. | |
| 3,005,861 A | 10/1961 | Tiller et al. | |
| 3,493,823 A | 2/1970 | Nishizawa Junichi et al. | |
| 3,527,622 A | 9/1970 | Angus et al. | |
| 4,608,319 A | 8/1986 | Croopnick et al. | |
| 6,013,204 A | 1/2000 | Kanatzidis et al. | |
| 6,225,548 B1 | 5/2001 | Sakakibara et al. | |
| 6,744,110 B2 | 6/2004 | Sterzel et al. | |
| 7,342,169 B2 | 3/2008 | Venkatasubramanian et al. | |

(Continued)

FOREIGN PATENT DOCUMENTS

| | | |
|---|---|---|
| JP | 9074229 | 3/1997 |
| JP | 2002289930 | 10/2002 |
| JP | 2003225743 | 8/2003 |

OTHER PUBLICATIONS

Partin. Lead strontium telluride and lead barium telluride grown by molecular-beam epitaxy. J. Vac. Sci. Technol. B 5, 686 (1987).*

(Continued)

*Primary Examiner* — Matthew E Hoban
(74) *Attorney, Agent, or Firm* — Bell & Manning, LLC

(57) ABSTRACT

Composites comprising a continuous matrix formed from compounds having a rock salt structure (represented by the structure "MQ") and inclusions comprising chalcogenide compounds having a rock salt structure (represented by the structure "AB") are provided. Composites having the structure MQ-ABC$_2$, where MQ represents a matrix material and ABC$_2$ represents inclusions comprising a chalcogenide dispersed in the matrix material are also provided.

21 Claims, 42 Drawing Sheets

(56) References Cited

U.S. PATENT DOCUMENTS

| | | | |
|---|---|---|---|
| 7,365,265 | B2 | 4/2008 | Heremans et al. |
| 7,465,871 | B2 | 12/2008 | Chen et al. |
| 2002/0062854 | A1 | 5/2002 | Sharp |
| 2004/0200519 | A1 | 10/2004 | Sterzel et al. |
| 2006/0272697 | A1 | 12/2006 | Kanatzidis et al. |
| 2007/0227577 | A1 | 10/2007 | Sterzel et al. |
| 2008/0241050 | A1 | 10/2008 | Kanatzidis et al. |
| 2009/0178700 | A1 | 7/2009 | Heremans et al. |
| 2010/0025616 | A1 | 2/2010 | Kanatzidis et al. |

OTHER PUBLICATIONS

Harman. Nanostructured Thermoelectric Materials. Journal of Electronic Materials, vol. 34, No. 5, 2005.*

Sealy. A comparison of phase equilibria in some II-IV-VI compounds based on PbTe. Journal of Materials Science $ (1973) 1731-1737.*

Lawson. A Method of Growing Single Crystals of Lead Telluride and Lead Selenide. Journal of Applied Physics. vol. 22, No. 12, Dec. 1951.*

J. Androulakis et al, Nanostructuring and High Thermoelectric Efficiency in p-Type, $Ag(Pb^{1-y}Sn_y)_mSbTe_{2+m}$, Adv. Mater, 2006, pp. 1170-1173, vol. 18.

J. Androulakis et al, Spinodal Decomposition and Nucleation and Growth as a Means to Bulk Nanostructured Thermoelectrics: Enhanced Performance in $Pb_{1-x}Sn_xTe$-PbS, J. Am. Chem. Soc., 2007, pp. 9780-9788, vol. 129, No. 31.

J. Sootsman et al, Transport behavior and thermal conductivity reduction in the composite system PbTe- Pb-Sb, Mater. Res. Soc. Symp. Proc., vol. 1044, 2008, pp. 327-332.

P.F.P. Poudeu , High Thermoelectric Figure of Merit and Nanostructuring in Bulk p-type $Na_{1-x}Pb_mSb_yTe_{m+2}$, Angew. Chem. Int. Ed., 2006, pp. 3835-3839, vol. 45.

J.P. Heremans et al, Enhancement of Thermoelectric Efficiency in PbTe by Distortion of the Electronic Density of States, Science, 2008, pp. 554-557, vol. 321.

M.-K. Han et al, Substitution of Bi for Sb and its role in the thermoelectric properties and Nanostructuring in $Ag_{1-x}Pb_{18}MTe_{20}$ (M = Bi, Sb) (x = 0, 0.14, 0.3), Chem. Mater., 2008, pp. 3512-3520, vol. 20.

Y.K. Koh et al, Lattice thermal conductivity of nanostructured thermoelectric materials based on PbTe, Appl. Phys. Lett., 2009, pp. 153101/1-153101/3, vol. 94, No. 15.

K. Ahn et al, Improvement in the thermoelectric figure of merit by La/Ag co-substitution in PbTe, Chem. Mater, 2009, pp. 1361-1367, vol. 21, No. 7.

J.R. Sootsman et al, Large enhancements in the thermoelectric power factor of bulk PbTe at high temperature by synergistic nanostructuring, Angew. Chem. Int. Ed., 2008, pp. 8618-8622, vol. 47, No. 45.

D.L. Partin et al, Lead calcium telluride grown by molecular beam epitaxy, J. Vac. Sci. Technol. B, Mar./Apr. 1986, pp. 578-580, vol. 4, No. 2, American Vacuum Society.

Dale L. Partin, Lead Salt Quantum Effect Structures, IEEE Journal of Quantum Electronics, Aug. 1988, pp. 1716-1743, vol. 24, No. 8.

D.L. Partin et al, Lead strontium telluride and lead barium telluride grown by molecular-beam epitaxy, J. Vac. Sci. Technol. B, May/Jun. 1987, pp. 686-689, vol. 5, No. 3, American Vacuum Society.

Nobuhiro Sakurai et al, Lead-Strontium-Telluride Film and Lasers Prepared by Hot-Wall Epitaxy, Jpn. J. Appl. Phys., Jan. 1994, pp. 151-154, vol. 33 part 1, No. 1A.

Kanatzidis et al., Recent Developments in Bulk Thermoelectric Materials, MRS Bulletin, vol. 31, Mar. 2006, pp. 199-205.

International Search Report and Written Opinion received in PCT/US2010/048881, Jun. 24, 2011.

* cited by examiner (a)        (b)        (c)

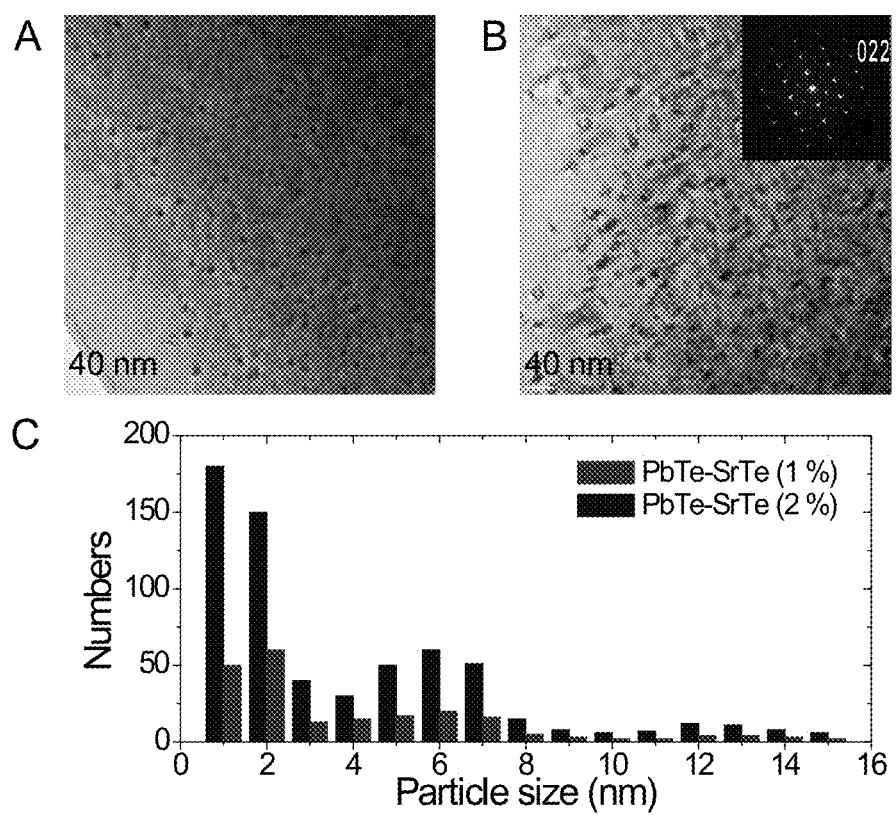
Figure 19 (A-C)

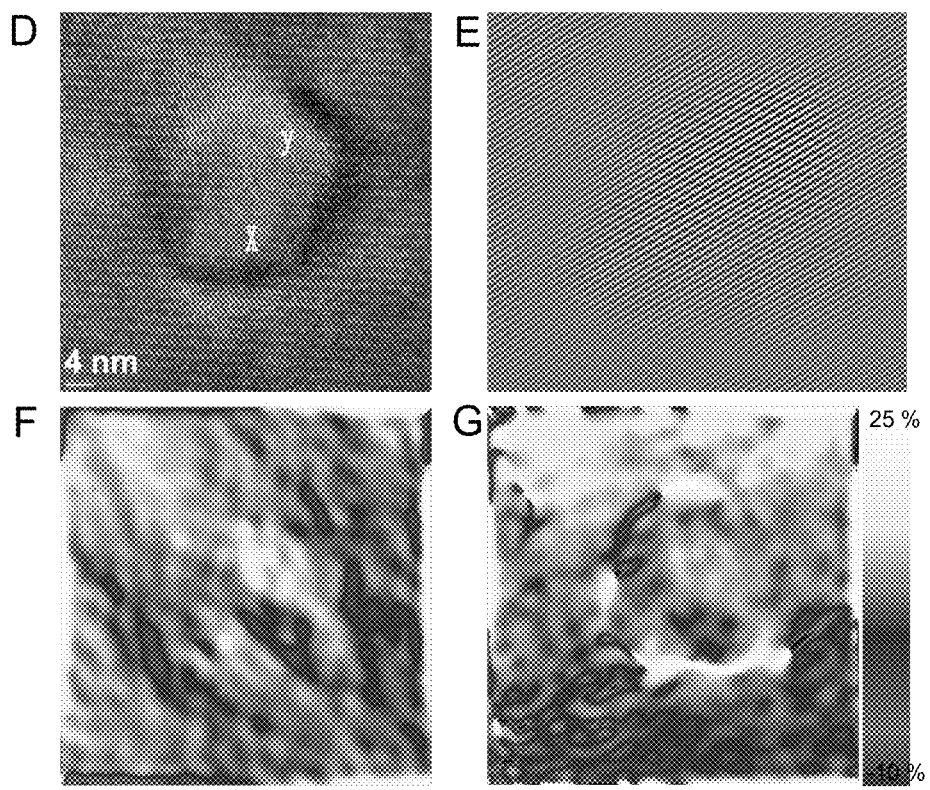
Figure 19 (D-G)

THERMOELECTRICS COMPOSITIONS COMPRISING NANOSCALE INCLUSIONS IN A CHALCOGENIDE MATRIX

STATEMENT REGARDING FEDERALLY SPONSORED RESEARCH OR DEVELOPMENT

This invention was made with government support under N00014-08-1-0613 awarded by Office of Naval Research. The government has certain rights in the invention.

CROSS-REFERENCE TO RELATED APPLICATIONS

This application claims priority to U.S. provisional patent application 61/245,990, filed on Sep. 25, 2009; U.S. provisional patent application 61/246,309, filed on Sep. 28, 2009; and U.S. provisional patent application 61/311,523, filed on Mar. 8, 2010, the entire contents of which are hereby incorporated by reference.

BACKGROUND

Thermoelectric devices such as power generators, heat pumps, coolers and thermal sensors have advantages over traditional energy converting systems in several aspects: high reliability, portable weight, no maintenance required, and environmentally friendly. Thermoelectric devices, which can directly convert heat into electricity, could play an important role in the future of energy conversion, management, and utilization. However, the low efficiency of present energy conversion thermoelectric devices, limits the ability of those devices to completely or even partially replace the equipment in traditional energy converting systems.

The efficiency of thermoelectric materials is related to the dimensionless figure of merit ZT, where $ZT=(\sigma S^2/\kappa)T$ and $\sigma$ is the electrical conductivity, S the thermopower or absolute Seebeck coefficient, T is the temperature, and $\kappa$ is the thermal conductivity. Currently, PbTe and Si/Ge alloys are the basic thermoelectric materials used for power generation and, once doped appropriately, can possess a maximum ZT of approximately 0.8 at 600 K and 1 at 1200 K, respectively.

Typically, there are two ways to improve the ZT of thermoelectric materials: one is to enhance the power factor ($\sigma S^2$) and the other is to lower the lattice thermal conductivity. Approaches to increase the power factor include introducing a resonance level in the valence band, e.g., in Tl—PbTe (see, J. P. Heremans et al., Enhancement of thermoelectric efficiency in PbTe by distortion of the electronic density of states. *Science* 321, 554-557 (2008) and S. Ahmad, K. Hoang, S. D. Mahanti, Ab Initio study of deep defect states in narrow band-gap semiconductors: group III impurities in PbTe. *Phys. Rev. Lett.* 96, 56403(1-4) (2006)) or by synergistic nanostructuring (see, J. R. Sootsman et al., Large enhancement in the power factor of bulk PbTe at high temperature by synergistic nanostructuring. *Angew. Chem. Int. Ed.* 47, 8618-8622 (2008)). Nanoscale inclusions in bulk materials can dramatically suppress the lattice thermal conductivity by scattering the longer wavelength heat-carrying phonons to achieve high ZT. Nanostructured bulk materials such as $AgPb_mSbTe_{m+2}$ (see, K. F. Hsu, et al., Cubic $AgPb_mSbTe_{2+m}$: bulk thermoelectric materials with high figure of merit. *Science* 303, 818-821 (2004), E. Quarez, et al. Nanostructuring, compositional fluctuations, and atomic ordering in the thermoelectric materials $AgPb_mSbTe_{2+m}$. The myth of solid solutions. *J. Am. Chem. Soc.* 127, 9177-9190 (2005) and M. Zhou, J.-F. Li, T. Kita, Nanostructured $AgPb_mSbTe_{2+m}$ system bulk materials with enhanced thermoelectric performance. *J. Am. Chem. Soc.* 130, 4527-4532 (2008)), $AgPb_mSn_nSbTe_{2+m+n}$ (see, J. Androulakis et al., Nanostructuring and high thermoelectric efficiency in p-type $Ag(Pb_{1-y}Sn_y)_mSbTe_{2+m}$. *Adv. Mater.* 18, 1170-1173 (2006)), $NaPb_mSbTe_{2+m}$ (see, P. F. P. Poudeu et al., High thermoelectric figure of merit and nanostructuring in bulk p-type $Na_{1-x}Pb_mSb_yTe_{2+m}$. *Angew. Chem. Int. Ed.* 45, 3835-3839 (2006)), PbTe—PbS (see, J. Androulakis et al., Spinoidal decomposition and nucleation and growth as a means to bulk nanostructured thermoelectric: enhanced performance in $Pb_{1-x}Sn_xTe$—PbS. *J. Am. Chem. Soc.* 129, 9780-9788 (2007)) and BiSbTe (see, B. Poudel, et al., High-thermoelectric performance of nanostructured bismuth antimony telluride bulk alloys. *Science* 320, 634-638 (2008)) are examples of this approach. In all of these cases, however, the power factor also takes a hit because the nanostructuring simultaneously increases carrier scattering which adversely affects the carrier mobilities.

SUMMARY

One aspect of the invention provides composites comprising a continuous matrix comprising a compound with a rock salt structure and nanoscale inclusions also comprising a compound with a rock salt structure (represented as AB) dispersed within the matrix. The materials are desirably doped to increase their electrical conductivity. The rock salt compounds of the matrix can be represented by the structure MQ, where M is Ge, Sn, or Pb and Q is S, Se, or Te, and the rock salt compounds of the inclusions can be represented by the structure AB, where AB can represent an alkaline earth chalcogenide, where A is an alkaline earth element and B is S, Se or Te.

In some embodiments, the inclusions are coherently or semicoherently (endotaxially) embedded in the matrix, such that at least one of the cation (A) sublattice or anion (B) sublattice align with at least one of the atom sublattices of the matrix material. In the resulting structure, the nanoscale inclusions can inhibit heat flow through the composite via strong acoustic phonon scattering at the matrix-inclusion interface, without decreasing the carrier (e.g., hole) mobility through the material. In some embodiments, the carrier mobility in the composite can be higher than that of the matrix material. As a result, these composites are able to achieve very high ZT values.

In some embodiments, the composite is formed from a mixture of PbTe and an alkaline earth chalcogenide, the composite comprising a matrix comprising PbTe and a second phase comprising the alkaline earth chalcogenide dispersed in the matrix. The second phase comprises particles precipitated out of the mixture of PbTe and the alkaline earth chalcogenide. The composite has a ZT value greater than that of PbTe. Examples of alkaline earth chalcogenides that can be combined with the PbTe are SrTe, SrSe, CaTe, CaSe, BaTe, BaSe, BeTe, BeSe, MgTe and MgSe.

In some embodiments, the composites further comprise a dopant that increases the electrical conductivity of the composite. The dopants can be p-type or n-type. Examples of suitable p-type dopants include $Na_2Te$, $K_2Te$, Na, K, Tl, As and Ag. Examples of suitable n-type dopants include Sb, Bi, Pb and $MI_x$, where M is a divalent or trivalent transition or main group metal and x is 2 or 3. Doped composites can have a particularly high ZT value. For example, such doped composites can have a ZT at 620 K of at least 1. This includes embodiments in which the composites have a ZT at 620 K of at least 1.2 and further includes embodiments in which the composites have a ZT of at least about 1.3 at 620 K. Some embodiments of the composites comprising p-type dopants with endotaxially aligned inclusions have ZT values of at least 1.7 at 800 K.

The precipitate particles are desirably sized to scatter high energy phonons, thereby lowering the thermal conductivity and increasing the ZT of the composites. Thus, in some embodiments, the precipitate particles have an average diameter of no greater than about 150 nm (e.g., about 1 nm to about 150 nm, about 50 to about 100 nm, or no greater than about 100 nm, no greater than about 50 nm, no greater than about 20 nm or no greater than about 10 nm).

One specific embodiment of the present invention provides a $Na_{0.02}Sr_xPbTe_{1.01+x}$ material that includes a matrix comprising PbTe and inclusions comprising SrTe. This material can be formed by combining PbTe (as a compound or as separate elements) and SrTe (as a compound or as separate elements) with Na as a dopant (provided as $Na_2Te$). More information about this type of embodiment is provided in the Examples 1 and 3, below.

Another specific embodiment of the present composites comprises a matrix comprising PbTe, inclusions comprising CaTe and Na as a dopant (provided as $Na_2Te$). More information about this type of embodiment is provided in Example 2, below.

Another aspect of the invention provides a method of forming a composite of the type described above, the method comprising combining a first rock salt compound (e.g., PbTe) (or the elements of a first rock salt compound) and a second rock salt compound (e.g. an alkaline earth chalcogenide) (or the elements of a second rock salt compound) in a ratio sufficient to form a composite comprising a matrix comprising the first rock salt compound and a second phase comprising the second rock salt compound dispersed in the matrix, the second phase comprising particles precipitated out of the mixture of the first rock salt compound and the second rock salt compound, wherein the composite has a ZT value greater than that of first rock salt compound.

Yet another aspect of the present invention provides a composite having the structure $MQ-ABC_2$, where MQ represents a matrix material and $ABC_2$ represents the material of inclusions dispersed in the matrix material. In these composites, M can be Ge, Sn, or Pb, Q can be S, Se, or Te, A can be Pb or Ge, B is Sn, and C can be S or Se. In some embodiments, the composite has a higher thermoelectric figure of merit (ZT) than the Ge, Sn or Pb chalcogenide of the matrix.

The composites of this aspect of the invention can be characterized by their high ZT values at room temperature (298 K) and/or at elevated temperatures. For example, in some embodiments the composites have a ZT of at least about 0.5 at 298 K. This includes composites having a ZT of at least about 0.55 at 298 K and further includes composites having a ZT of at least 0.6 at 298 K. The composites can be doped to increase their electrical conductivities. At elevated temperatures, such doped composites can have particularly high ZT values. For example, in some embodiments the doped composites have a ZT of at least 1 at 700 K. This includes embodiments in which the doped composites have a ZT of at least 1.1 at 700 K and further includes embodiments in which the doped composites have a ZT of at least 1.2 at 700 K.

The inclusions in the composites of this aspect of the invention can take the form of lamellae in the matrix. The lamellae are desirably sized and structured to scatter high energy acoustic phonons, resulting in a lowering of the lattice thermal conductivity and, therefore, an increased ZT for the composite relative to the chalcogenide of the matrix in the absence of the inclusions. For example, the lamellae themselves can comprise bilayers that are sized to scatter high energy acoustic phonons. The dimensions of the lamellae can vary over a significant range. For example, in some embodiments, the lamellae have an average width (diameter) of about 20 nm to about 200 nm (e.g., about 50 nm to about 100 nm) and average lengths greater than 100 nm, greater than 1 micron, or greater than 10 microns. However, dimensions outside of these ranges are also possible.

In some embodiments the lattice thermal conductivity of the chalcogenide is at least two times larger than that of the composite in the temperature range of 289 K to 600 K. This includes embodiments in which the lattice thermal conductivity of the chalcogenide is at least three times larger than that of the composite in the temperature range of 289 K to 600 K.

The inclusions are desirably present in amounts sufficient to optimize the ZT value of the composite. For example, in some embodiments the inclusions make up no greater than about 25 mol. % of the composite. This includes embodiments in which the inclusions make up no greater than about 10 mol. % of the composite, further includes embodiments in which the inclusions make up no greater than about 6 mol. % of the composite and still further includes embodiments in which the inclusions make up no greater than about 3 mol. % of the composite.

One specific embodiment of the present composites provides a matrix comprising PbTe and inclusions comprising $PbSnS_2$ embedded in the matrix This composite can optionally be doped with a dopant, such as $PbI_2$, and desirably has a $PbSnS_2$ content of no greater than about 6 mol. %. An embodiment of this type is described in greater detail in Example 4.

Another aspect of the invention provides a method of forming a composite, the method comprising reacting two or more (e.g., three) Ge, Sn or Pb chalcogenides (or the elements thereof) in quantities sufficient to form a matrix comprising a Ge, Sn or Pb chalcogenide with lamellar inclusions comprising a solid solution of SnS or SnSe with Pb or Ge embedded in the matrix, wherein the composite has a higher thermoelectric figure of merit (ZT) than the Ge, Sn or Pb chalcogenide from which the matrix is composed.

One specific embodiment of this method comprises reacting PbTe, SnTe and PbS in quantities sufficient to form a matrix comprising PbTe and lamellar inclusions comprising $PbSnS_2$ embedded in the matrix. An embodiment of this type of method is described in greater detail in Example 4.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 19. Low magnification TEM images of (A) PbTe—SrTe (1 mol. %) and (B) PbTe—SrTe (2 mol. %) doped with 1 mol. % $Na_2Te$. The inset in (B) shows the corresponding electron diffraction pattern which confirms the complete alignment of SrTe and PbTe lattices. (C) SrTe nanocrystal size distribution histogram. (D) Lattice image of an endotaxial nanocrystal of SrTe in the PbTe matrix clearly depicting a coherent boundary between precipitate and matrix. (E) IFFT image shows four dislocation cores at the boundary. The strain distribution of the nanoscale inclusions along the (F) 110 and (G) 001 directions, respectively, which show plastic strain around four dislocation cores. The shaded bar indicates 25-10% strain.

DETAILED DESCRIPTION

Figure 1:
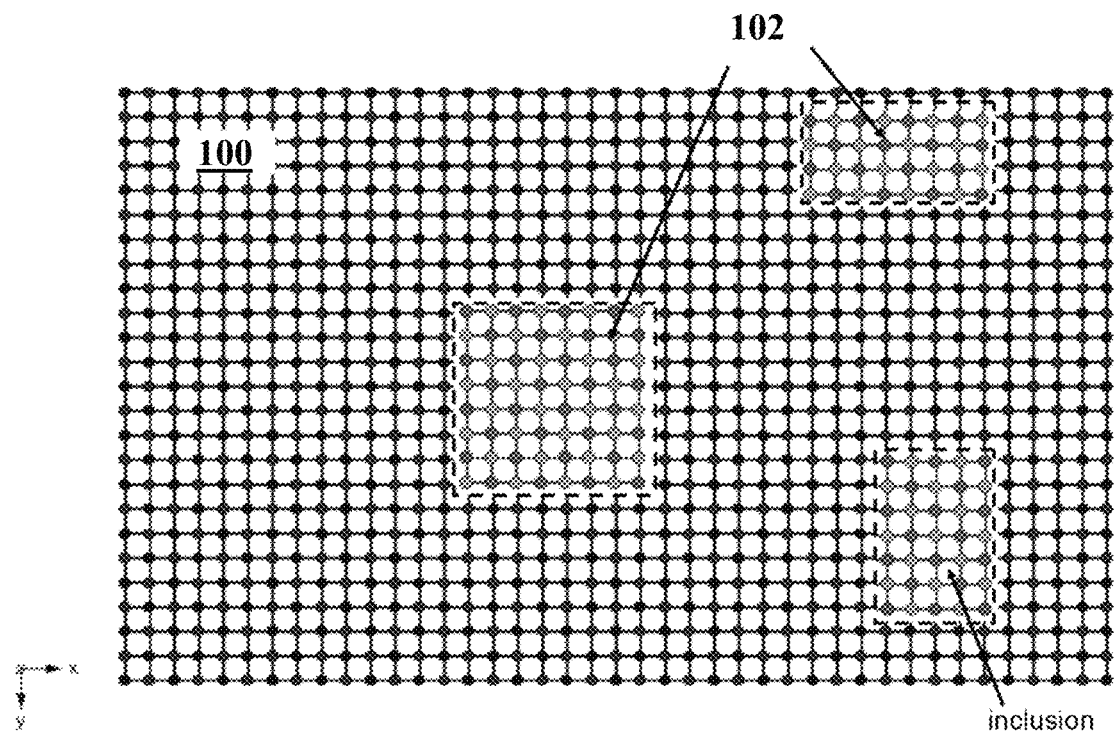
FIG. 1. Endotaxial nanoscale inclusions of AB in an MQ matrix. Endotaxy is the placement of a crystal of material X in a matrix of material Y wherein there is near lattice matching between the lattice of X and that of Y in all directions in space. This creates coherent and semicoherent interfaces on all crystal sides and crystal faces of X.

One aspect of the invention provides a composite comprising a continuous matrix formed from rock salt compounds (represented by the structure "MQ") and inclusions formed from another rock salt compound (represented by the structure "AB"). The lattices of the matrix and the inclusions desirably are coherently or semicoherently aligned such that the electronic density of states or the electronic structure of the composite material is not significantly changed relative to that of the matrix material. As a result charge carriers can pass through the material without scattering from the coherent nanoinclusions. FIG. 19 illustrates a composite composed of a matrix 100 and nanoscale inclusions 102 in which the lattice of the matrix and the lattice of the inclusions are coherently (or semicoherently) aligned. When the lattices of the matrix and the inclusions are aligned crystallographically, as shown in FIG. 19, phonon transport is decoupled from electron transport, making is possible to achieve higher ZT values.

In some embodiments, the composite is a material system based on Sr, Pb and Te and appropriate dopants with high p-type electrical performance and a high figure of merit. In order to provide a low lattice thermal conductivity for achieving a high figure of merit (ZT) and superior thermoelectric performance, the present high-ZT thermoelectric materials comprise nano- or micro-structured islands ("inclusions") with controlled sizes and morphologies in bulk materials.

In one embodiment of the present compositions, SrTe is inserted into a lead telluride system. The result is a material with a lower thermal conductivity (especially lattice conductivity) and increased ZT value. The SrTe also increases the melting point of the material and extends the application temperature into a higher range (700-900 K). These compositions, doped with, for example, $Na_2Te$, can exhibit nano-structured precipitates, low thermal conductivity and p-type electrical conductivity with a high ZT of, for example, at least 1.3 at 600-800 K or even at least 1.7 at 800 K.

In another embodiment of the present compositions, CaTe is inserted into a lead telluride system. Again, the result is a material with a lower thermal conductivity and a higher ZT. These compositions, doped with, for example, $Na_2Te$, can exhibit a ZT of at least 1.4 at 800 K.

In various other embodiments, Ca, Be, Mg, and Ba can be used instead of Sr and $K_2Te$, Na, K, Tl and Ag can be used as p-type dopants, rather than $Na_2Te$. In addition, Sb, Bi, Pb, and $MI_x$ (M=divalent and trivalent transition and main group metal, X=2 or 3) can be used as n-type dopants in these systems. Other alkaline-earth chalcogenides such as SrSe, CaTe, CaSe, BaTe, BaSe, BeTe, BeSe, MgTe, and MgSe can also be used to achieve an enhancement in ZT. Typical concentrations for the dopants in the present materials can range from about 0.01 to 3 mol. % (molar fractions).

Another aspect of the invention extends the type of rock salt compounds from which the inclusions can be formed to ternary derivatives of the type $ABC_2$, where A and B are cations and C are anions, wherein the C sublattice is similar to, and can match, the Q sublattice of the matrix. For purposes of illustration, the invention is described below with respect to an embodiment that provides nanostructured thermoelectric composites of PbTe—$PbSnS_2$. However, it should be understood that the invention is not limited to this embodiment.

As shown in Example 4, incorporation of increased concentrations (e.g., >5 mol. %) of Sn into the PbTe—PbS system results in the formation of a distinct $PbSnS_2$ phase. $PbSnS_2$ (mineralogical name teallite) is an end member of the SnS mineral series of the orthorhombic space group Pnma. While $PbSnS_2$ and SnS are soluble in each other, SnS is only about 3-4% soluble in PbS. The crystal structure of $PbSnS_2$ exhibits Pb—Sn bilayers which form a superstructure along the a axis. Each bilayer is approximately 0.6 nm thick, sufficiently small to effectively scatter high-energy acoustic phonons at elevated temperature. The corresponding lattice thermal conductivity is significantly reduced over bulk PbTe on the range of 0.2-0.6 W/mK, with a resulting ZT of 1.3 for PbTe—$PbSnS_2$ 3 mol. %.

Potential commercial application for the present compositions include automobiles, heavy trucks and vehicles, coal burning electric utilities, and nuclear reactor facilities. Anything that uses an internal combustion engine (moving or stationary) can use these thermoelectric materials to convert waste heat to electrical energy conversion for enhanced energy-efficiency.

EXAMPLES

The following examples describe methods of making and characterizing thermo-electric materials in accordance with the invention.

Examples 1 and 2

Powder X-Ray Diffraction.

The powder diffraction patterns for the compositions were obtained using Mo $K_\alpha$ (λ=0.71073 Å) radiation in a reflection geometry on an Inel diffractometer equipped with a position sensitive detector operating at 40 kV and 20 mA. Data acquisition was controlled via the in-situ program. X-ray powder diffraction patterns showed single phase products crystallized in a cubic fcc lattice (NaCl-type).

Thermal Conductivity.

Specific heat (Cp) and thermal diffusivity (D) were determined as a function of temperature by the flash diffusivity-heat method (NETZSCH LFA 457 MicroFlash instrument). The front face of a small disc-shaped sample (Φ=8 mm; thickness≈1-2 mm) was heated by a short energy pulse (e.g. a laser beam). Thermal conductivity (κ) can be calculated from the relationship $K_{tot}(T)=D(T)Cp(T)\rho(T)$, where D is the thermal diffusivity, Cp is the specific heat, and ρ is the density of the sample. Lattice thermal conductivities can be obtained from the total thermal conductivity using the equation $K_{(lattice)}=K_{(total)}-K_{(carrier)}$, where $K_{(carrier)}$ is expressed by the Wiendemann-Franz law $K_{(carrier)}=L\sigma T$ (L is the Lorenz number).

Electrical Measurement.

Electrical conductivity and Seebeck coefficients were measured simultaneously under a helium atmosphere from room temperature to about 750K on a ULVAC-RIKO ZEM-3 instrument system. The typical samples for measurement had a rectangular shape with the dimensions of 3 mm×3 mm×8 mm.

High-Resolution Transmission Electron Microscopy (HRTEM).

The micro-structures of as-synthesized samples were examined using high-resolution transmission electron microscopy (HRTEM). The samples for TEM were prepared by the traditional methods of lapping, dimple grinding and ion-mill polishing (water is replaced by ethanol due to moisture sensitivity).

Example 1

SrTe—PbTe—$Na_2Te$

Synthesis.

Ingots (~10 g) with nominal compositions of $Na_{0.02}Sr_xPbTe_{1.01+x}$ (x=0.01, 0.02 and 0.03) were synthesized by mixing appropriate stoichiometric ratios of high purity starting materials such as Pb, Te, $Na_2Te$ and SrTe in carbon-coated quartz tubes under an Ar-filled dry box. The tubes were sealed under high vacuum (~$10^{-4}$ Torr) and heated up to 1050° C. over 15 hours (h) and held there for 6 hours. After that, the samples slowly cooled to 600° C. at a rate of 11° C./h and then to room temperature over 10 h. Because the ingots were slightly moisture-sensitive and relatively brittle, the samples were polished using ethanol as a solvent. For comparison, one sample $Sr_{0.02}PbTe_{1.02}$ without $Na_2Te$ as dopants was also synthesized using the same procedure. All starting materials were loaded in an Ar-filled dry box due to the poor stability of $Na_2Te$ and $SrTe$ in air.

Characterization.

Figure 2A:
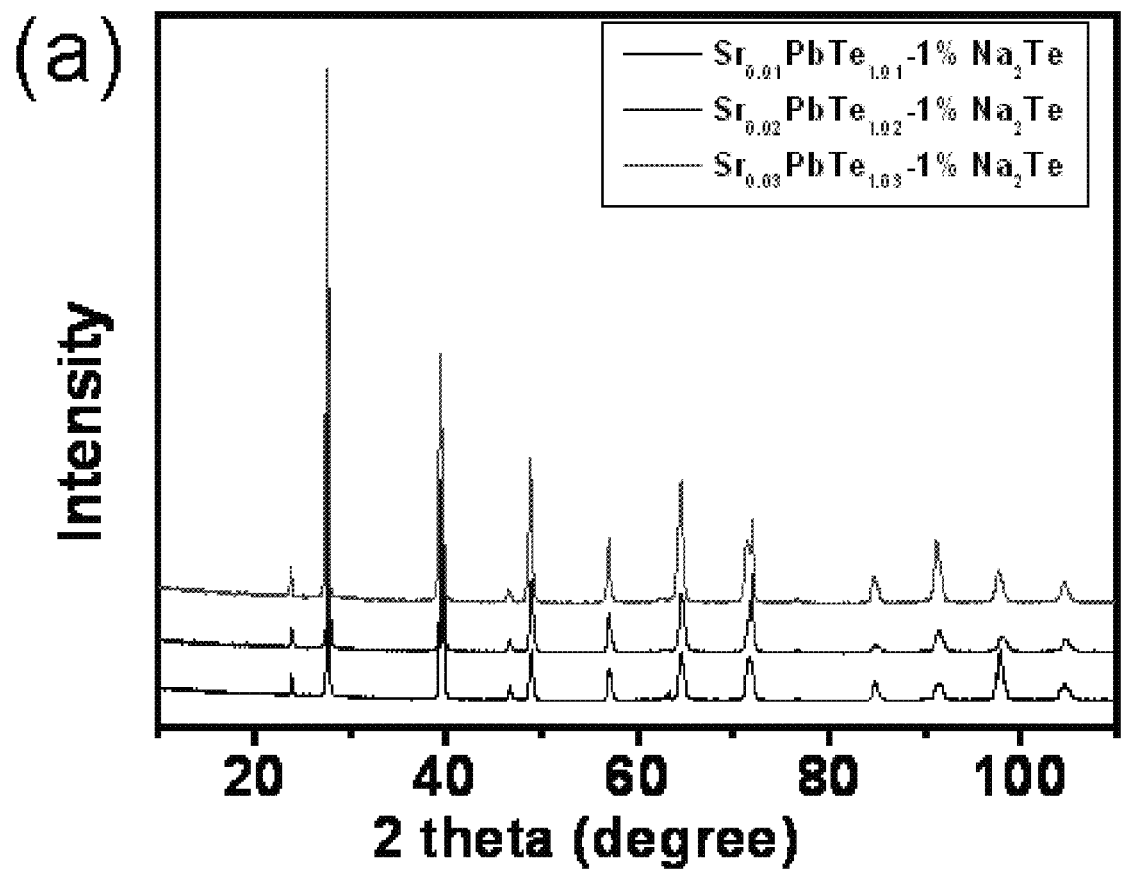
FIG. 2. (a) Power X-ray diffraction patterns of $Na_{0.02}Sr_xPbTe_{1.01+x}$ samples; (b) Variation of the unit cell parameter as a function of x for $Na_{0.02}Sr_xPbTe_{1.01+x}$ samples.
Figure 2B:
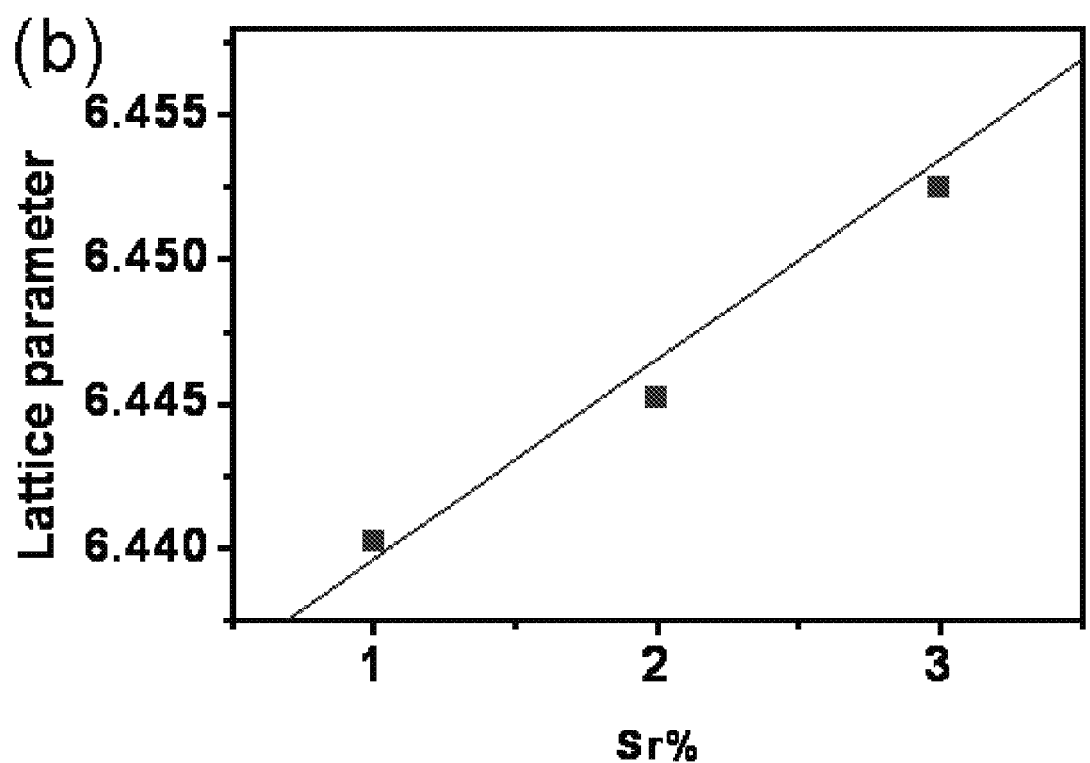

The X-ray powder diffraction patterns (FIG. 2a) show that as-prepared samples crystallize in a cubic NaCl-type structure with the space group of Fm-3m. The refined lattice parameters (FIG. 2b) showed a linear increase with increasing Sr amount. This is consistent with the isomorphic substitution in cation positions of smaller Pb atoms (radius ~1.80 Å) by larger Sr atoms (radius ~2.00 Å). All $Na_2Te$-doped samples are p-type materials due to the deficiency of Na accommodated in the $Na_{0.02}Sr_xPbTe_{1.01+x}$ system.

Transport Properties.

Figure 3:
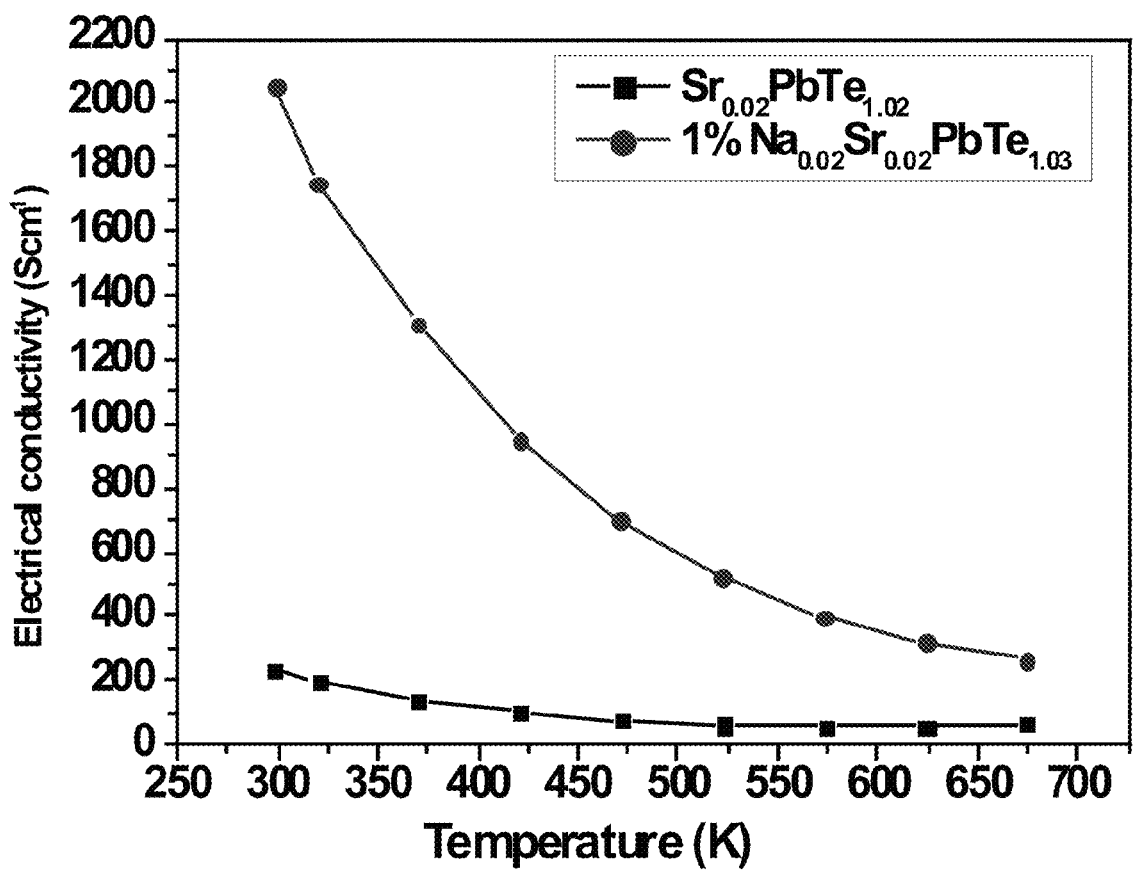
FIG. 3. Temperature dependence of electrical conductivity of $Sr_{0.02}PbTe_{1.02}$ and $Na_{0.02}Sr_{0.02}PbTe_{1.03}$.

Temperature dependence of the electrical conductivity σ of $Sr_{0.02}PbTe_{1.02}$ and $Na_{0.02}Sr_{0.02}PbTe_{1.03}$ is shown in FIG. 3. The conductivities of both samples decrease with increasing temperature. However, the conductivity for $Na_{0.02}Sr_{0.02}PbTe_{1.03}$ is 2050 $Scm^{-1}$ at room temperature, which is nine times bigger than the conductivity for undoped $Sr_{0.02}PbTe_{1.02}$ (230 $Scm^{-1}$). Over the entire range of measurement, the conductivity for $Na_{0.02}Sr_{0.02}PbTe_{1.03}$ is several times higher than that of $Sr_{0.02}PbTe_{1.02}$. Clearly, $Na_2Te$ is an important dopant to form degenerated semiconductors in the $Sr_xPbTe_{1+x}$ system and to increase the carrier concentration.

Figure 4:
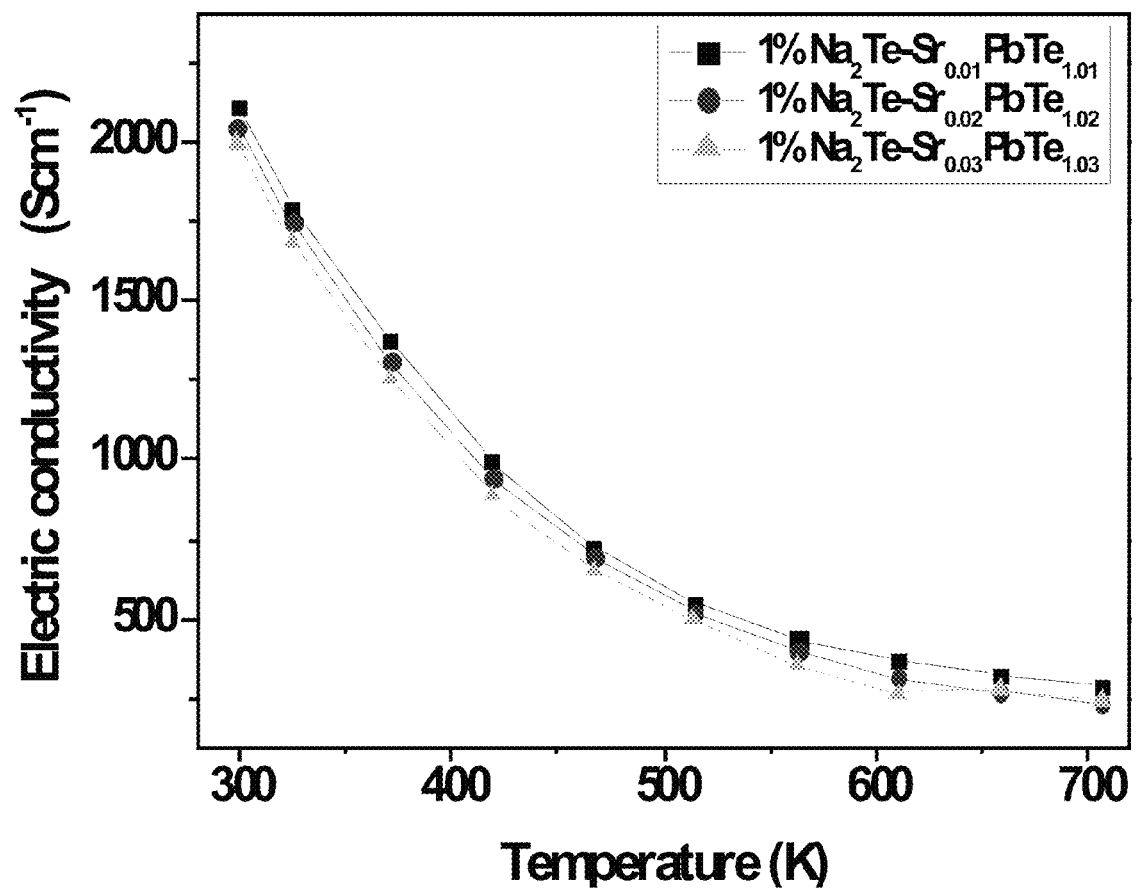
FIG. 4. Temperature-depended electrical conductivity of $Na_{0.02}Sr_xPbTe_{1.01+x}$.
Figure 5:
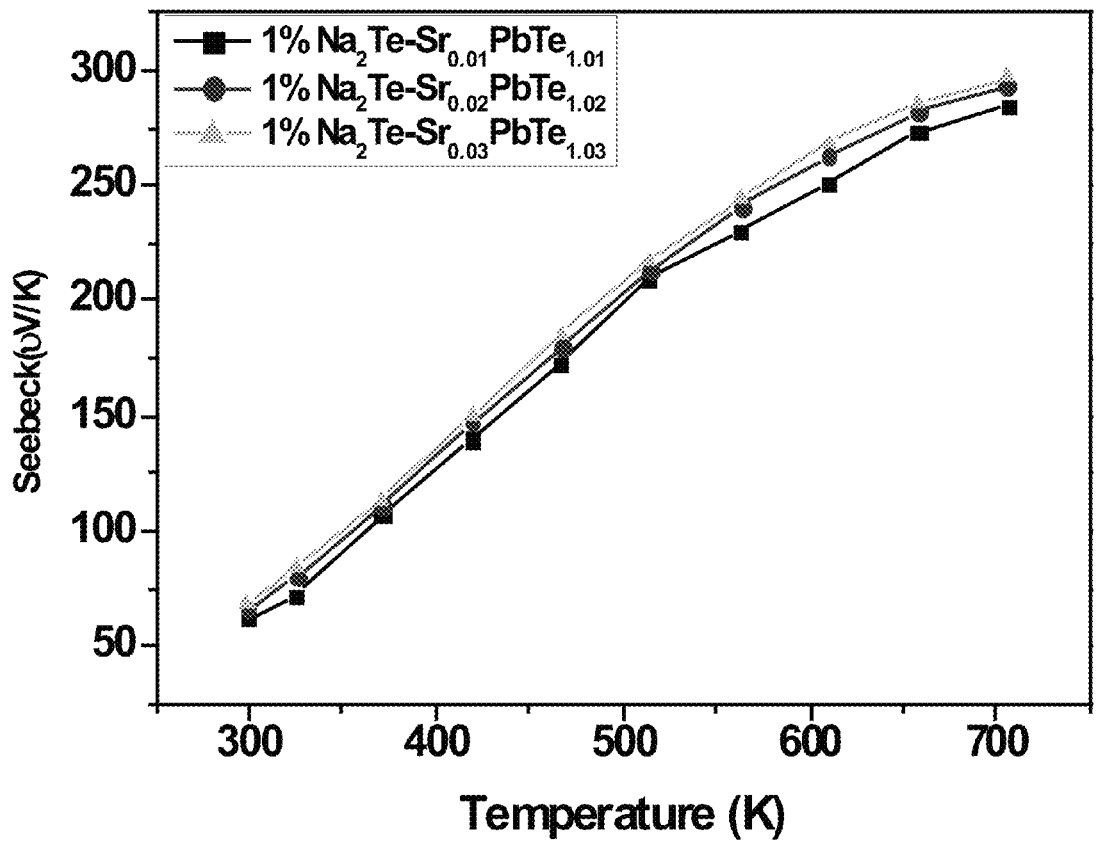
FIG. 5. Temperature-depended Seebeck coefficients of $Na_{0.02}Sr_xPbTe_{1.01+x}$.

The temperature-depended electrical conductivity a of $Na_{0.02}Sr_xPbTe_{1.01+x}$ is shown in FIG. 4. Regardless of composition, the electrical conductivity monotonically decreases with increasing temperature, indicating degenerate conduction for the entire measured temperature range. Ingots with the composition $Na_{0.02}Sr_{0.02}PbTe_{1.03}$ exhibit an electrical conductivity of σ=2050 $Scm^{-1}$ with a positive thermo power of S=78 µV/K at room temperature. This leads to relatively high power factor of PF=9 $\mu Wcm^{-1}K^{-2}$. The conductivity decreases with increasing temperature, which is consistent with degenerate semiconductors, and reaches σ=450 $scm^{-1}$ at 700 K. However, as shown in FIG. 5, the thermopower increases rapidly to S=270 µV/K, yielding a much higher power factor (PF) of at least 21 $\mu Wcm^{-1}K^{-2}$. For samples of $Na_{0.02}Sr_{0.01}PbTe_{1.02}$ and $Na_{0.02}Sr_{0.03}PbTe_{1.04}$, electrical conductivities of 2100 $Scm^{-1}$ and 1999 $Scm^{-1}$, and Seebeck coefficients of 61.8 µV/K and 68.9 µV/K were observed at 300 K, which result in thermopower factors PF= 8.06 $\mu Wcm^{-1}K^{-2}$ and 9.51 $\mu Wcm^{-1}K^{-2}$ at 300 K, respectively.

Figure 6:
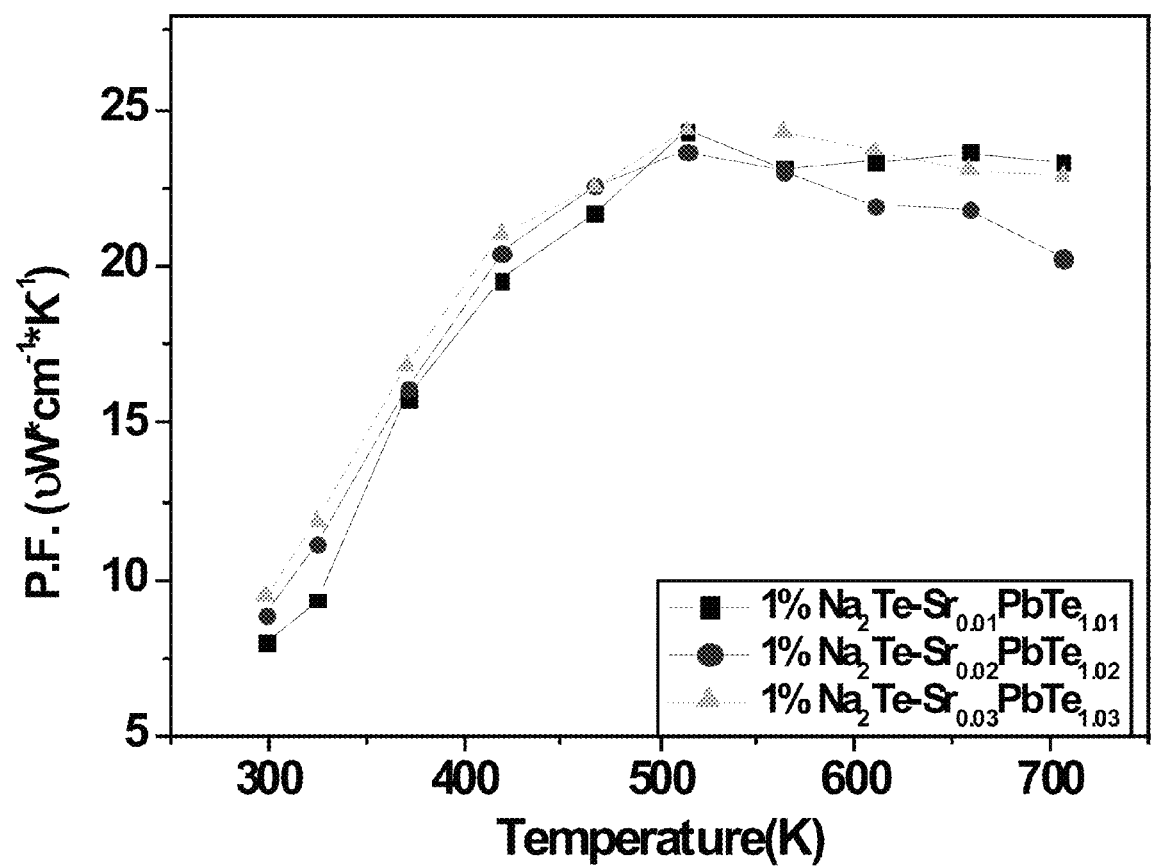
FIG. 6. Temperature-depended power factors of $Na_{0.02}Sr_xPbTe_{1.01+x}$.

All samples showed positive values of the thermopower over the entire measured temperature range, indicating p-type conduction, which is consistent with the donor property of Na sitting in Pb sites in the structure. Regardless of composition, the thermopowers of all samples increased with temperature (FIG. 6). For all samples in the measurement range, the power factor first increased with increasing temperature, reached a maximum and then decreased.

Figure 7:
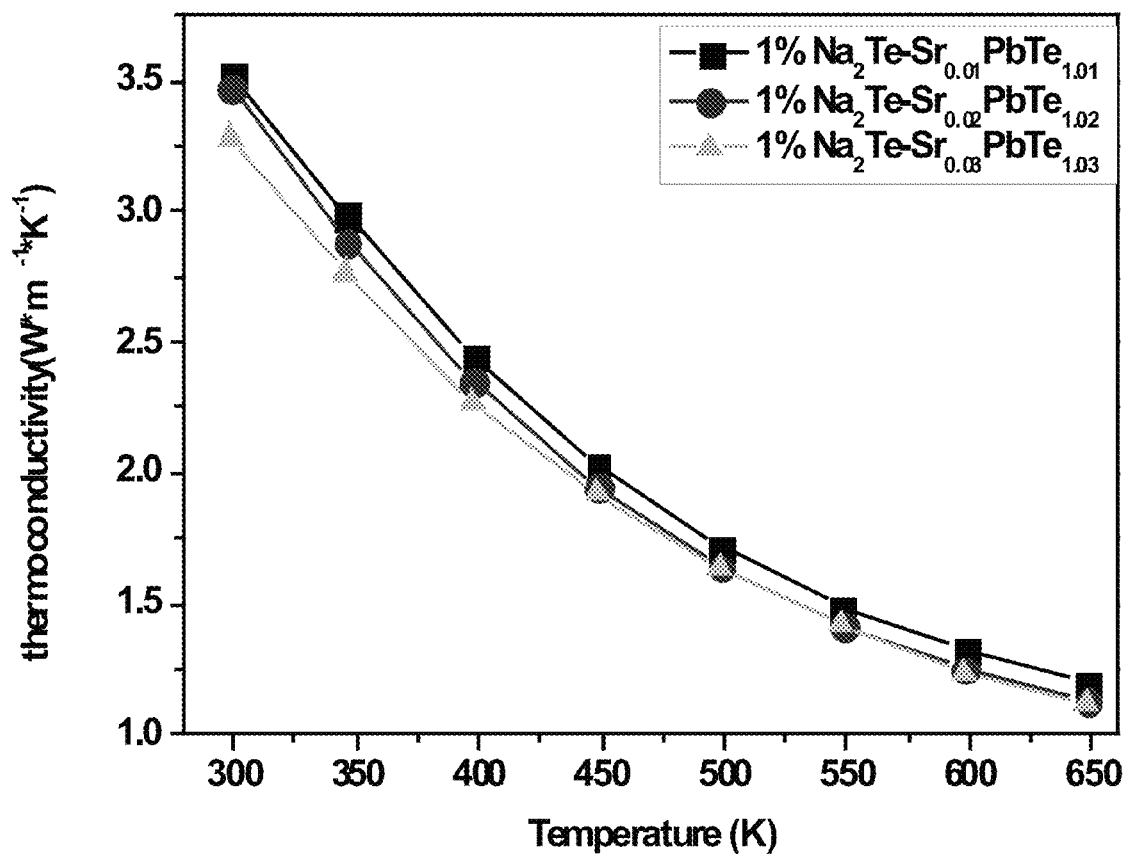
FIG. 7. Temperature-depended thermal conductivity of $Na_{0.02}Sr_xPbTe_{1.01+x}$.

Thermal diffusivity and heat capacity measurements as a function of temperature were measured for all of the samples. As shown in FIG. 7, the total thermal conductivity for all compositions decreased with increasing temperature. At each measured temperature, a higher concentration of SrTe resulted in lower thermal conductivity due to the stronger scattering of phonons. At high temperatures (650-700 K), $Na_{0.02}Sr_{0.03}PbTe_{1.04}$ gave abnormal results. The total thermal conductivity ($\kappa_{tot}$) is the sum of $\kappa_{elec}$ (the contribution from charge carriers) and $\kappa_{latt}$ (the contribution from lattice vibrations). Here, $\kappa_{elec}=L_0\sigma T$, where $L_0$ is the Lorenz number and T is the absolute temperature. The value of the Lorenz number for PbTe ($L_0=2.45*10^{-8}$ $W\Omega K^{-2}$) is used to estimate $\kappa_{elec}$. These two contributions are plotted in FIGS. 8a and 8b.

TEM Study.

Figure 9:
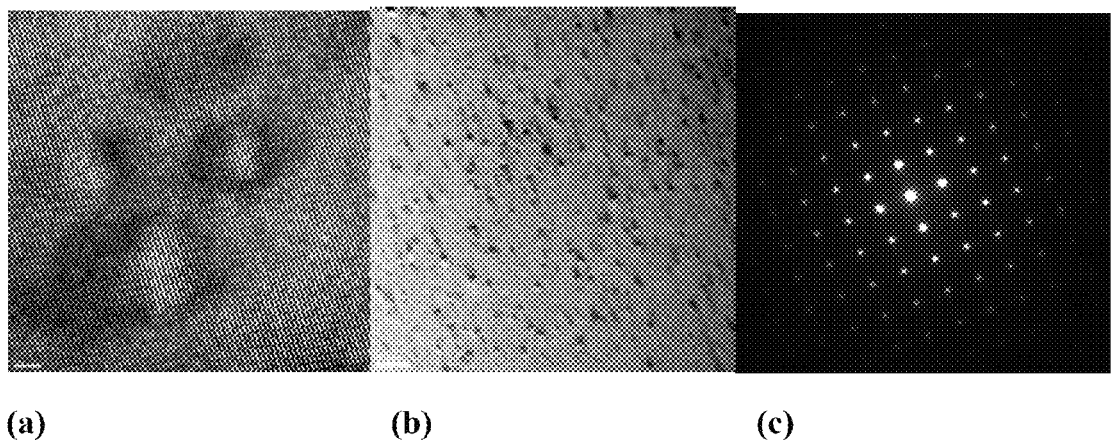
FIG. 9. TEM images of $Na_{0.02}Sr_{0.2}PbTe_{1.03}$. (a) and (b) Coherent SrTe nanoinclusions (nanocrystals of SrTe) embedded in the PbTe matrix. (c) The electronic diffraction pattern taken from image (b) indicating the coherence between the nanoinclusions and the matrix and the alignment of the crystal lattices of the two phases.
Figure 10A:
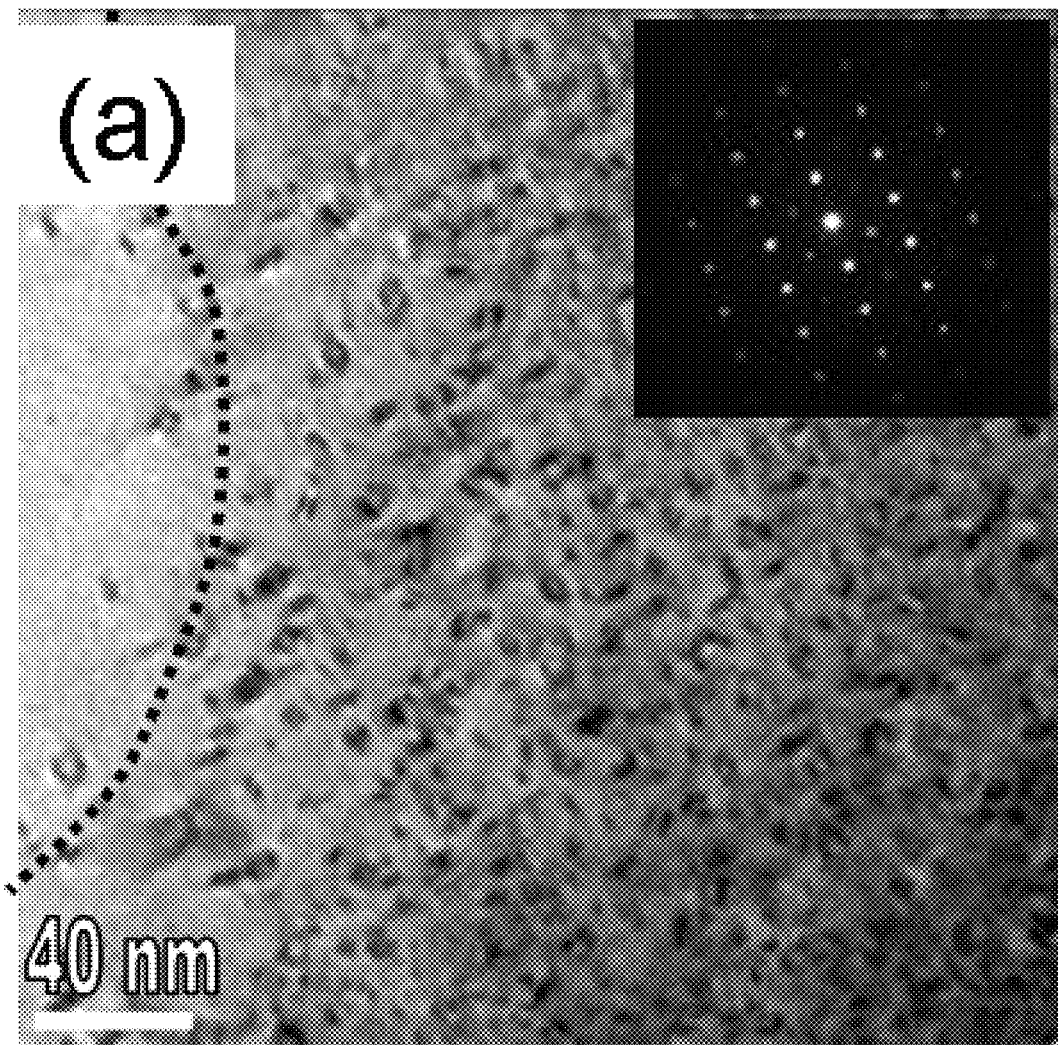
FIG. 10. Coherent precipitates of SrTe in a PbTe matrix (in a sample of $Na_{0.02}Sr_{0.2}PbTe_{1.03}$). (a) Low magnification image and, in the inset, the electronic diffraction pattern which shows only one lattice orientation is discernible because of the alignment of the SrTe and PbTe rock salt lattices. (b) Magnified image showing the coherent placement of SrTe nanocrystals in the PbTe matrix. The alignment of the lattice rows is visible.
Figure 10B:
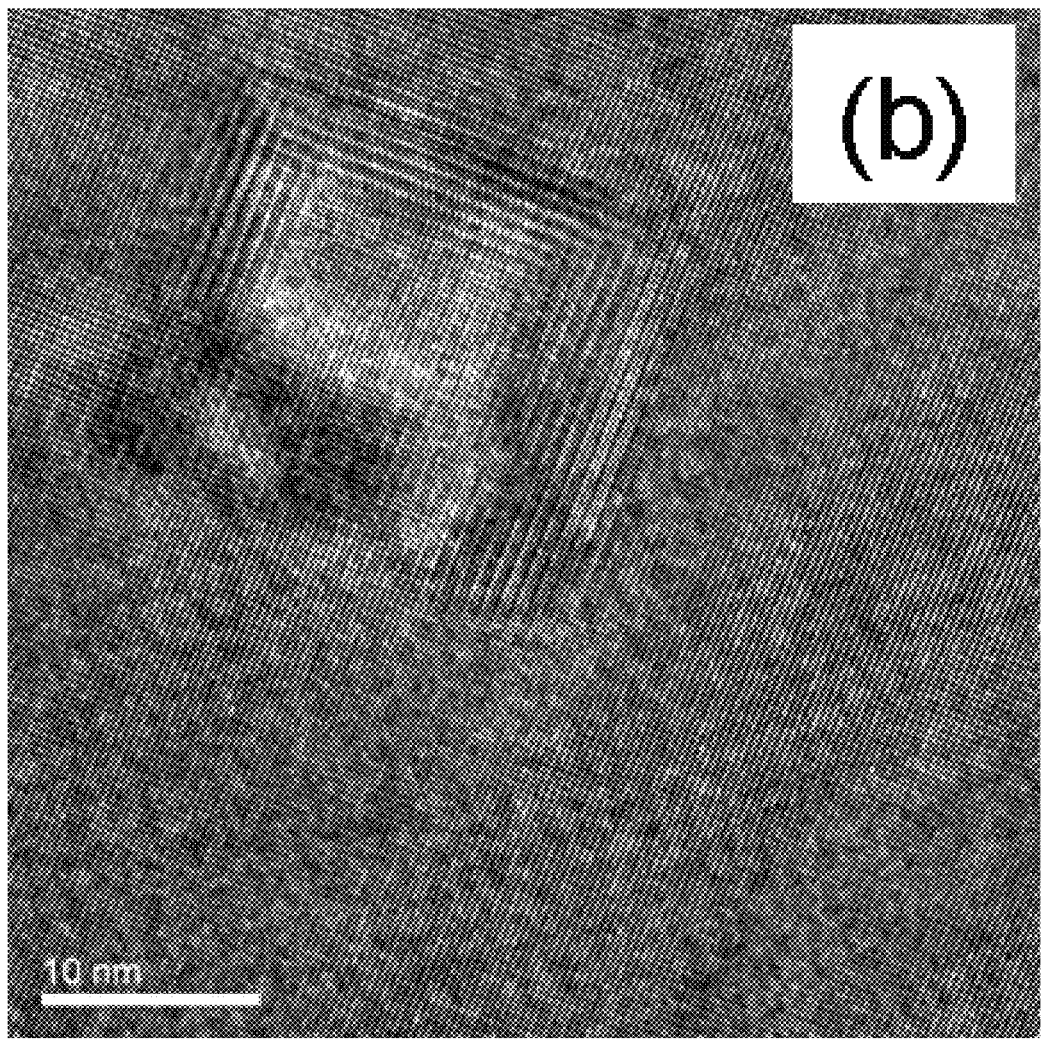

As shown in FIGS. 9 and 10, the HRTEM images of $Na_{0.02}Sr_{0.2}PbTe_{1.03}$ indicate that the $Na_{0.02}Sr_xPbTe_{1.01+x}$ was nano-structured on a 5-10 nm scale. In the low magnification TEM image of the sample, evenly dispersed nanoparticles can be seen. These images reveal the existence of lattice mismatch and possible fluctuations in composition.

Thermoelectric Figure of Merit (ZT).

Figure 11:
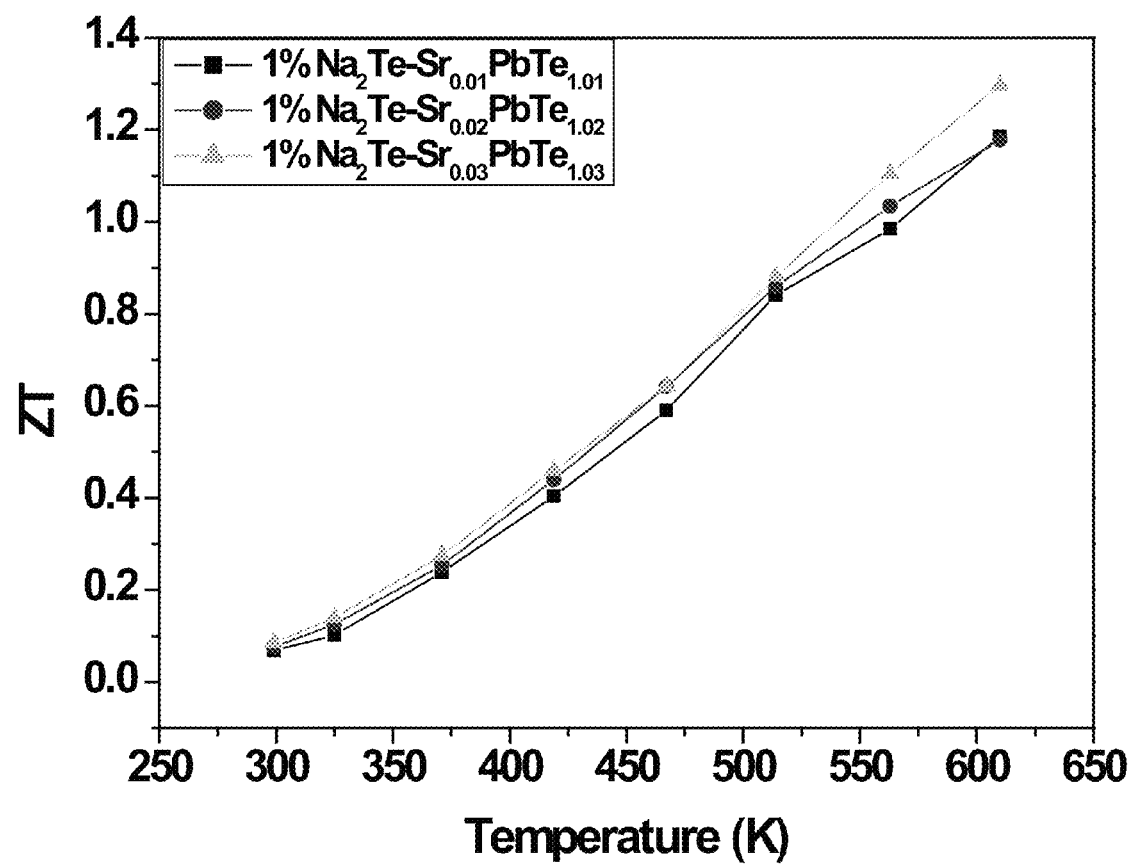
FIG. 11. Temperature dependence of the dimensionless figure of merit ZT for all thermoelectric material samples of Example 1.

FIG. 11 shows the temperature-dependence of ZT for all of the SrTe—PbTe—$Na_2Te$ samples. It can be seen that the value of ZT increases monotonically with an increase in temperature. The highest ZT observed for $Na_{0.02}Sr_{0.3}PbTe_{1.04}$ is 1.3 at 620 K. ZT could increase with increasing temperature.

Summary.

In this example, p-type thermoelectric materials $Na_{0.02}Sr_xPbTe_{1.01+x}$ have been prepared and characterized. The temperature-dependant parameters varying with SrTe content were investigated. The insertion of SrTe into the PbTe system strongly decreased the thermal conductivity. As a result, a larger ZT value of ~1.5 at 750 K was obtained for the sample $Na_{0.02}Sr_{0.3}PbTe_{1.04}$.

Example 2

CaTe—PbTe—$Na_2Te$

Synthesis.

Ingots (~10 g) with nominal compositions of PbTe—CaTe [CaTe=0.5-8 mol. %] doped with $Na_2Te$ (1 mol. %) were synthesized by mixing appropriate ratios of high purity starting materials of Pb, Te, Ca and $Na_2Te$ in carbon-coated quartz tubes under an Ar-filled glove box. The tubes were sealed under high vacuum (~$10^{-4}$ Torr) and heated up to 1323 K over 15 h and held there for 10 hours. After that, the samples slowly cooled to 873 K at a rate of 11 K/h and then cooled to room temperature over 15 h. Samples were cut and polished in the presence of ethanol for further electrical and thermal conductivity characterization.

Thermal Properties.

Figure 12:
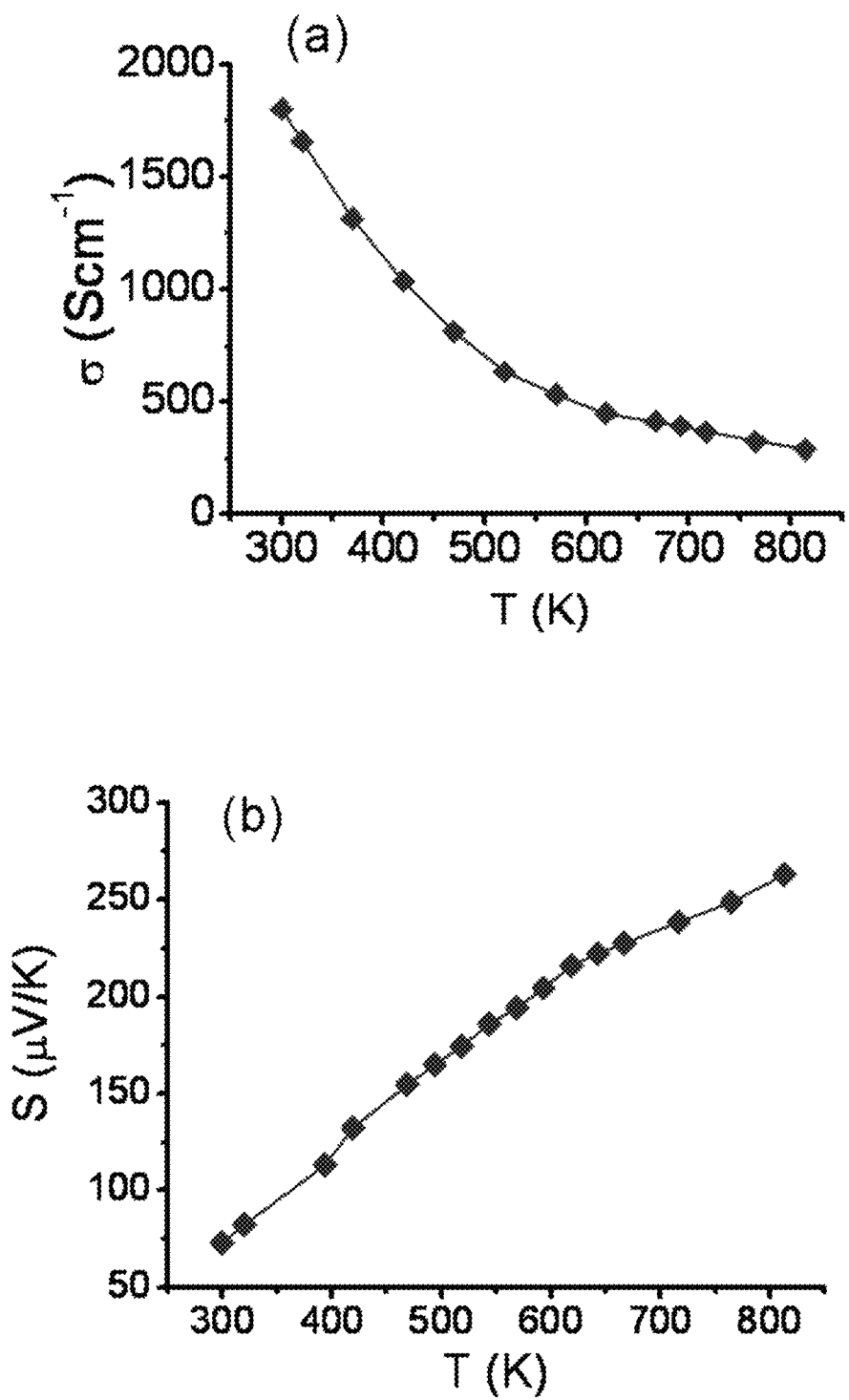
FIG. 12. (a) Electrical conductivity and (b) Seebeck coefficient of Na-doped PbTe-5 mol. % CaTe as a function of temperature.
Figure 13:
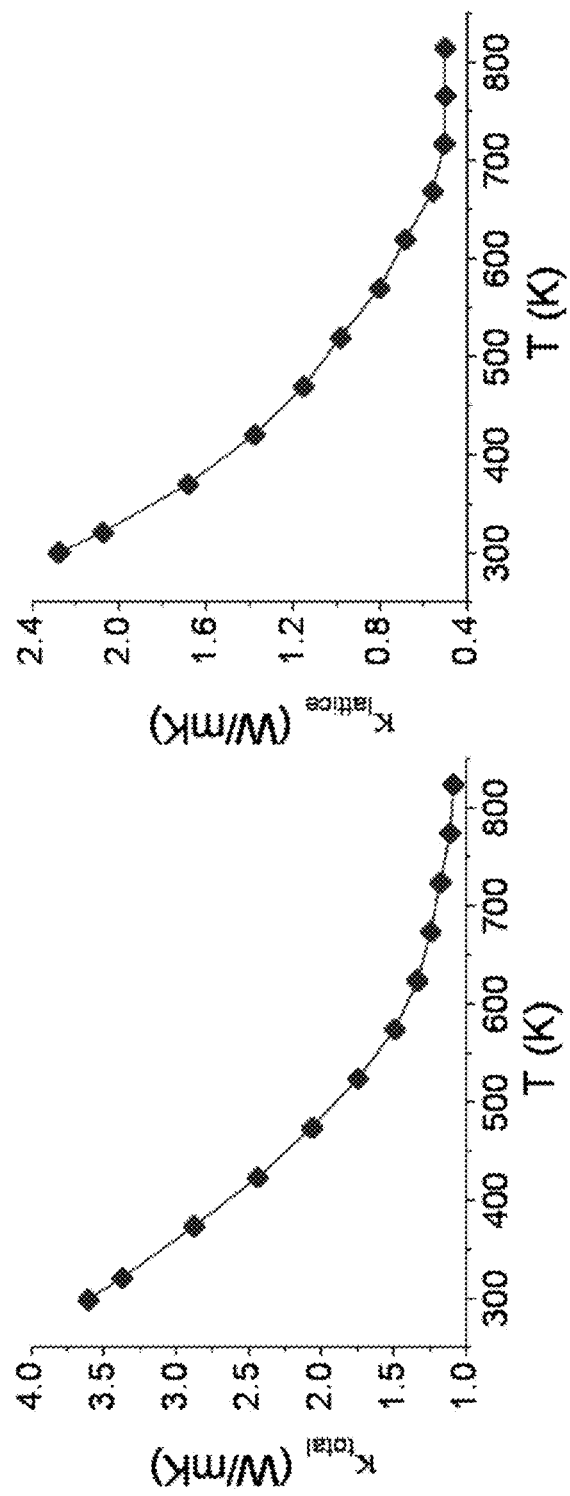
FIG. 13. Total thermal conductivity and lattice thermal conductivity of Na-doped PbTe-5 mol. % CaTe as a function of temperature.

The electrical conductivity and Seebeck coefficient of Na-doped PbTe-5 mol. % CaTe are shown in FIG. 12. The total thermal conductivity and lattice thermal conductivity of Na-doped PbTe-5 mol. % CaTe are shown in FIG. 13.

Figure 14:
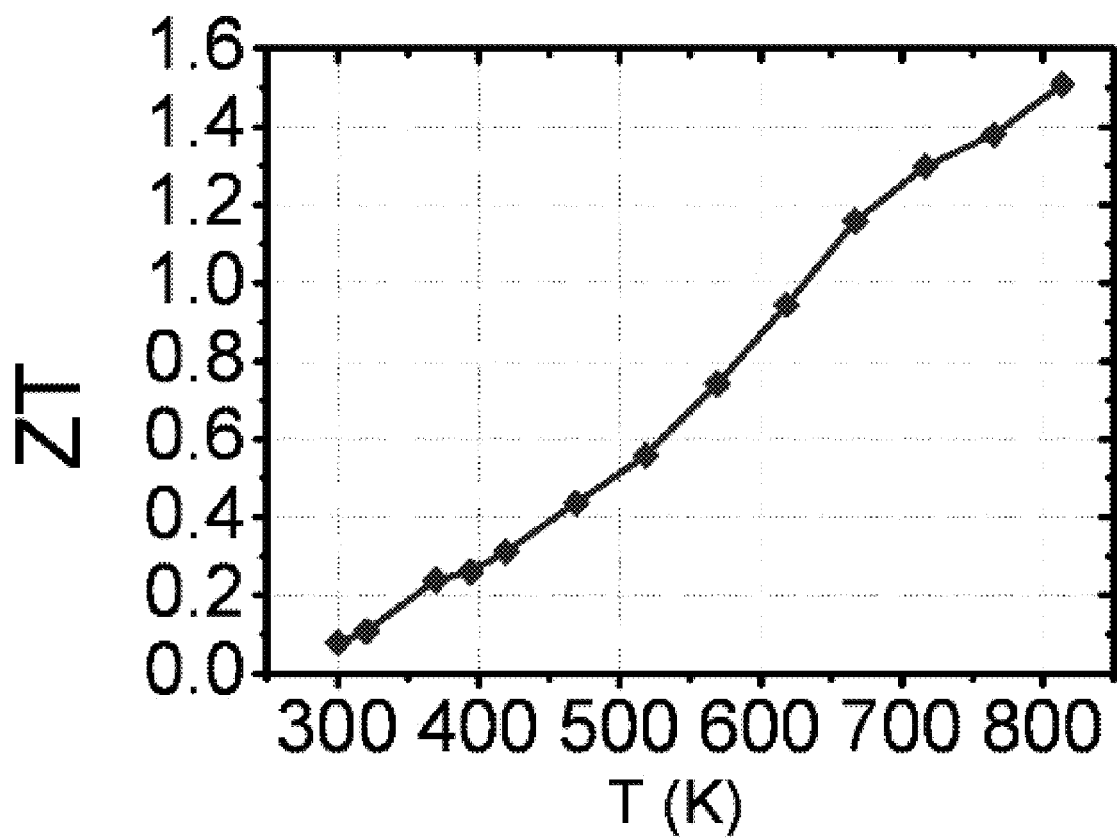
FIG. 14. ZT of Na-doped PbTe-5 mol. % CaTe as a function of temperature.

FIG. 14 shows the temperature-dependences of ZT for Na-doped PbTe-5 mol. % CaTe. It can be seen that the value of ZT increases monotonically with an increase of temperature. The highest ZT observed in this example was about 1.5 at 800 K.

Example 3

SrTe—PbTe—$Na_2Te$

Synthesis.

Ingots (~10 g) with nominal compositions of PbTe—SrTe [SrTe=0.5-2 mol. %] doped with $Na_2Te$ (1 mol. %) were synthesized by mixing appropriate ratios of high purity starting materials of Pb, Te, $Na_2Te$ and SrTe in carbon-coated quartz tubes under an Ar-filled glove box. The tubes were sealed under high vacuum (~$10^{-4}$ Torr) and heated up to 1323 K over 15 h and then held there for 10 hours. After that, the samples slowly cooled to 873 K at a rate of 11 K/h and then cooled to room temperature over 15 h. Samples were cut and polished in the presence of ethanol for further electrical and thermal conductivity characterization.

Powder X-Ray Diffraction.

The powder diffraction patterns were obtained using a Cu $K_\alpha$ ($\lambda$=1.548 Å) radiation in a reflection geometry on an Inel diffractometer equipped with a position sensitive detector and operating at 40 kV and 20 mA.

Thermogravimetric Analysis.

Thermogravimetric analysis was performed using a TGA-50 Shimadzu thermogravimetric analyzer under $N_2$ atmosphere in the temperature range of 300 to 900 K with a rate of 5 K/min.

Electrical Properties.

Electrical conductivity and Seebeck coefficients were measured simultaneously under a helium atmosphere at temperatures from room temperature to about 850 K on a ULVAC-RIKO ZEM-3 instrument system. Typical samples for measurement had a rectangular shape with the dimensions of ~2 mm×3 mm×8 mm. The longer direction coincides with the direction in which the thermal conductivity was measured. Heating and cooling cycles gave repeatable electrical properties for a given sample. Electrical properties obtained from different slices from the same ingot were similar.

Hall Measurements.

Hall coefficients were measured with a homemade high temperature apparatus, which provides a working range from 300 to 700 K. The samples were press-mounted and protected with argon gas to avoid possible oxidization at high temperature. The Hall resistance was monitored with a Linear Research AC Resistance Bridge (LR-700), with constant magnetic fields of ±1 T applied using an Oxford Superconducting Magnet.

Thermal Conductivity.

Thermal diffusivity, D, was directly measured and heat capacity, $C_p$, was indirectly derived using a standard sample (pyroceram) in the temperature range 300-850 K using the laser flash diffusivity method in a Netzsch LFA-457. Coins with ~8 mm diameter and ~2 mm thickness were used in all the measurements. Heating and cooling cycles gave repeatable diffusivity for a given sample. Thermal diffusivities obtained from different slices from the same ingot were similar. The total thermal conductivity, $\kappa_{total}$, was calculated using the formula, $\kappa_{total}=DC_p\rho$, where $\rho$ is the density of the sample, measured using sample dimension and mass. The sample density was also reconfirmed by gas pycnometer (Micromeritics AccuPyc 1340) measurements.

Transmission Electron Microscopy.

The samples were characterized under a JEOL 2100F transmission electron microscope (TEM). TEM samples were prepared by standard methods. The samples were cut into 3 nm-diameter discs by a disc cutter, then ground, dimpled, polished, and subsequently Ar-ion milled on a stage cooled with liquid nitrogen.

Characterization.

Figure 15:
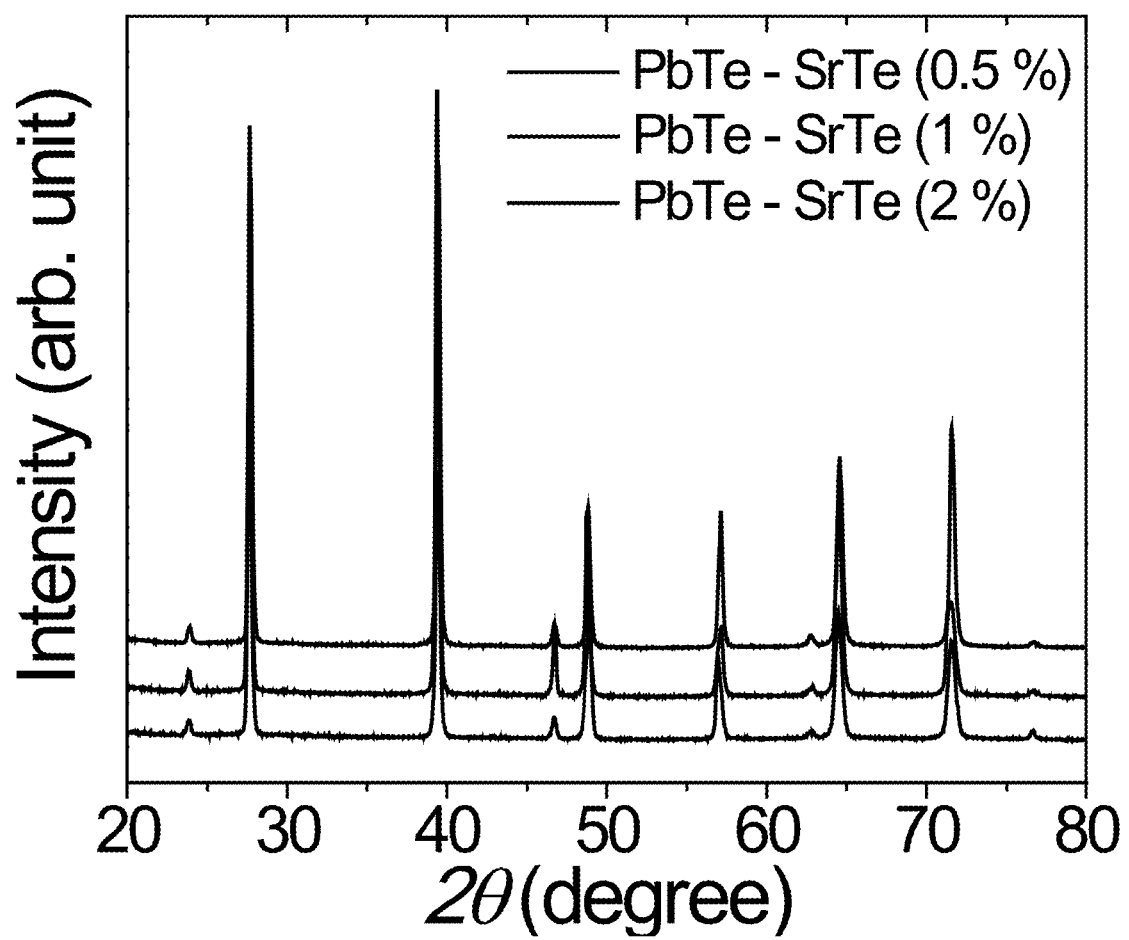
FIG. 15. Powder X-ray diffraction patterns of different PbTe—SrTe samples doped with 0.5 mol. % $Na_2Te$ (top pattern), 1 mol. % $Na_2Te$ (middle pattern), and 2 mol. % $Na_2Te$ (bottom pattern) from Example 3.

Powder X-ray diffraction patterns of the PbTe—SrTe samples (shown in FIG. 15) could be indexed on the PbTe structure with Fm$\bar{3}$m space group with no other phase present. Lattice parameters indicated an expansion from 6.4445 to 6.4606 Å with the increase in SrTe concentration from 0 to 2 mol. % in PbTe—SrTe samples doped with 1 mol. % $Na_2Te$. Overall, at low magnification, energy dispersive spectroscopy (EDS) agreed with the nominal composition. Thermogravimetric analysis (TGA) (not shown) showed that the samples were thermally stable up to 900 K.

Transport Properties.

Figure 16:
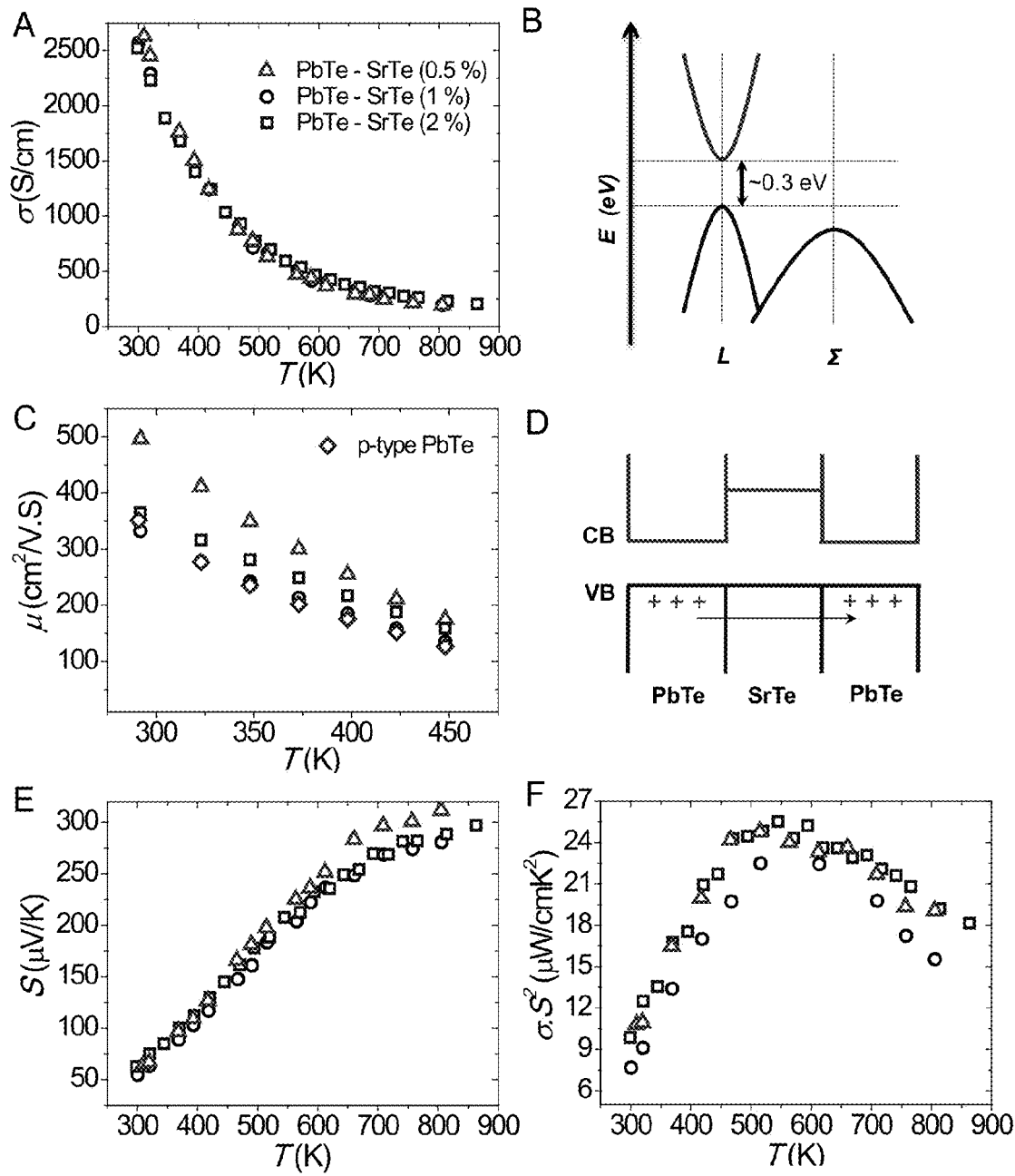
FIG. 16. (A) Temperature dependence of electrical conductivity (a) of different PbTe—SrTe samples doped with 1 mol. % $Na_2Te$. The same symbol notation for the sample is used in all plots of this figure. (B) Schematic representation of the electronic band structure energy diagram of PbTe at room temperature, highlighting the presence of a second valance band at Σ point. (C) Hole mobilities of different PbTe—SrTe samples doped with 1 mol. % $Na_2Te$ and a sample of optimized p-type PbTe derived from Hall coefficient measurements. (D) Schematic representation of the alignment of the valance band and conduction band energies of SrTe precipitates in the PbTe matrix. Temperature dependent (E) Seebeck coefficient (S) and (F) power factor ($\sigma S^2$) of different PbTe—SrTe samples doped with 1 mol. % $Na_2Te$.

FIG. 16A shows the temperature dependent electrical conductivity, $\sigma$, of different PbTe—SrTe samples doped with 1 mol. % $Na_2Te$. For all the samples, $\sigma$ decreased with increasing temperature, indicating degenerate conduction for the entire measurement range. There was very little effect on $\sigma$ with changing SrTe concentration. Typically, the conductivity of the 2 mol. % SrTe containing sample having a $\sigma$ of 2530 S/cm at room temperature decreased to ~240 S/cm at 800 K, FIG. 16A. The temperature dependent electrical conductivity data for 0.5, 1 and 2 mol. % SrTe containing samples doped with 1 mol. % $Na_2Te$ follows a temperature dependent power law, $\sigma \approx T^\delta$ with $\delta$=2.8, 2.7 and 2.4, respectively.

Figure 17:
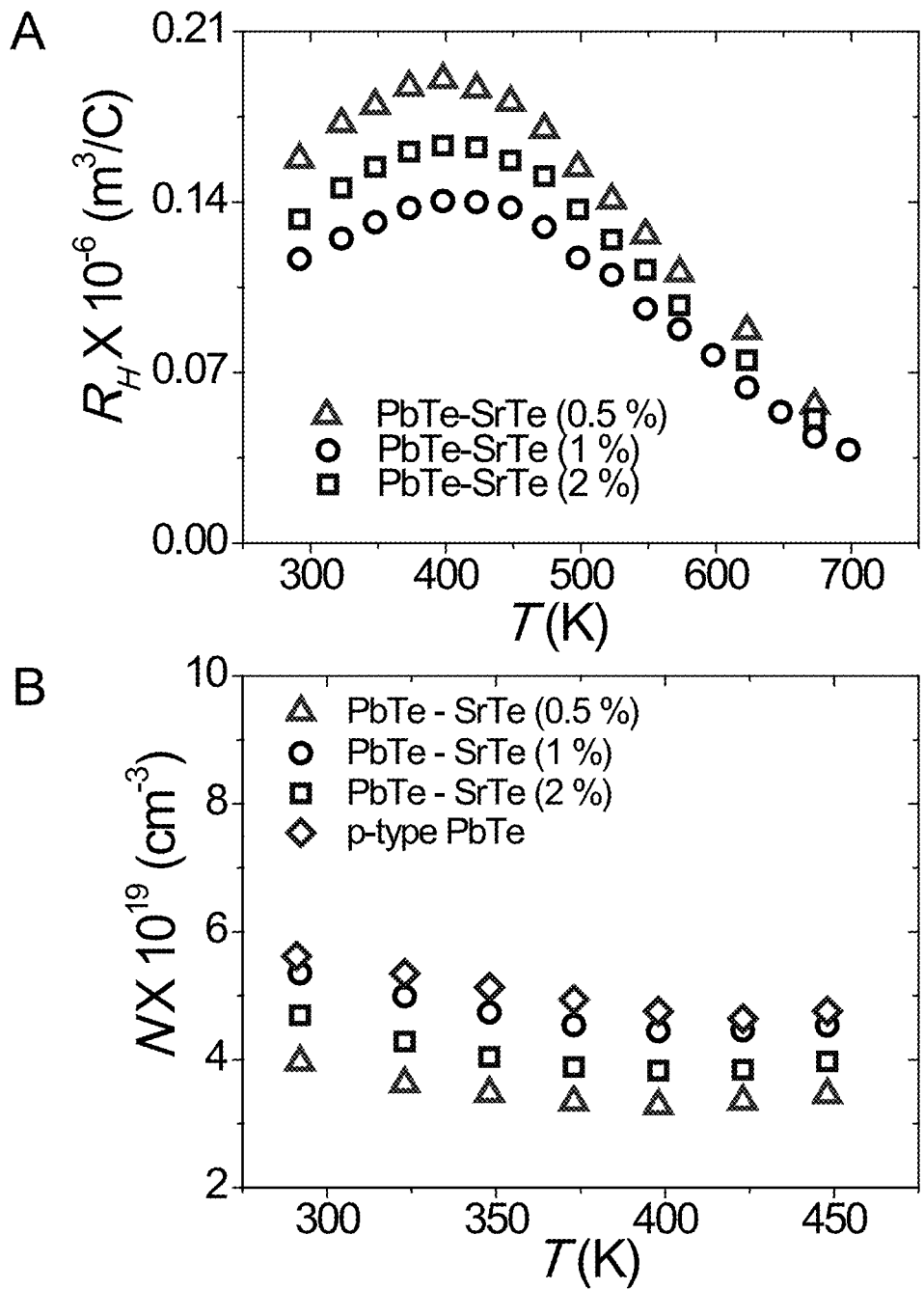
FIG. 17. Temperature dependent (A) Hall coefficient and (B) carrier concentration of different PbTe—SrTe samples doped with 1 mol. % $Na_2Te$, from Example 3.

The Hall coefficients, $R_H$, in the temperature range 300-700 K for different PbTe—SrTe samples doped with 1 mol. % $Na_2Te$ were positive and indicated p-type conduction (FIG. 17A). $R_H$ gradually increased, reaching a maximum at about 430 K and then decreased to lower values. The position of the maximum was almost independent of the sample content. This can be explained by the two valence band model (light-hole and heavy-hole valence bands) of PbTe (FIG. 16B). The energy gap difference between these two valence band maxima changes with increasing temperature. The increasing $R_H$ above about 300 K occurs due to the onset of transfer of carriers from the light-hole to the heavy-hole valance band. At about 450 K, the edges of the two valance bands are at approximately the same energy level and at temperatures above 450 K the main contribution to the transport comes from the heavy-hole valence band. Assuming parabolic bands and a single band conduction process below 450 K, the carrier concentration, n, was estimated to be ~5.4×10$^{19}$ holes/cm$^3$ (n=1/e$R_H$, where e is the electronic charge and $R_H$ is the Hall coefficient) at room temperature for the 1 mol. % SrTe containing sample (FIG. 17B). The room temperature Hall mobility, defined as $\mu=\sigma/ne$, was ~340 cm$^2$/V·s for 1 mol. % SrTe containing sample (FIG. 16C). Room temperature Hall mobility of standard p-type PbTe doped with 1 mol. % $Na_2Te$ with a similar carrier concentration of ~5.6×10$^{19}$ cm$^{-3}$ was measured to be ~350 cm$^2$/V·s (FIG. 16C). Therefore, the insertion of endotaxial SrTe nanocrystals in the PbTe matrix did not affect the hole scattering. The reason for this could be two-fold: a) the coherent interfaces and lattice alignment of SrTe and PbTe and b) the alignment of the valance band energy in the two materials (FIG. 16D).

Temperature dependent hole mobility data up to 450 K for different PbTe—SrTe samples doped with 1 mol. % $Na_2Te$ and standard PbTe doped with 1 mol. % $Na_2Te$ are presented in FIG. 16C for comparison. The carrier mobility data up to 450 K for 0.5, 1 and 2 mol. % SrTe containing PbTe doped with 1 mol. % $Na_2Te$ follow the temperature dependent power law, $\mu \approx T^\delta$, with exponent, $\delta$=2.4, 2.1 and 1.9 respectively. For pure PbTe, the canonical power law dependence of the mobility has an exponent $\delta$ close to 2.5. The slower rate of decrease in mobility with increasing SrTe concentration indicates the reduced scattering of the hole carriers in this system. This is important in achieving a comparatively enhanced power factor at high temperature.

FIG. 16E presents the Seebeck coefficient, S, of different PbTe—SrTe samples doped with 1 mol. % $Na_2Te$ as a function of temperature. The thermoelectric power response is positive, in agreement with the Hall measurements for a p-type PbTe. The highest room-temperature thermopower value measured was ~65 µV/K for the 0.5 mol. % SrTe containing sample which increased up to ~312 µV/K at ~800 K. Assuming a two valence band model of PbTe (FIG. 16B), the total Seebeck coefficient can be written as $S=\sigma^{-1}[S_e\sigma_e+S_{h1}\sigma_{h1}+S_{h2}\sigma_{h2}]$, where $S_e$ is the thermopower for electrons, $S_{h1}$ is the thermopower for light-holes and $S_{h2}$ is the thermopower for heavy-holes. At temperatures above 450 K, the main contribution to the total thermopower is made by the heavy-hole valance band which is key to achieving a high power factor. The value of effective hole mass in the second valence (heavy-hole) band is 1.5 times the effective mass of light-holes. In the case of degenerate semiconductors, the Seebeck coefficient is dependent on the effective mass of the carrier. Thus, the large value of thermopower at high temperatures in the case of the p-type PbTe—SrTe system can be explained by the contribution of the heavy-hole valance band.

FIG. 16F shows the power factor, $\sigma S^2$, of different PbTe—SrTe samples doped with 1% $Na_2Te$ as a function of temperature. The highest room temperature power factor value measured was ~11 µW/K for the 2 mol. % SrTe containing sample which increased to a maximum (~25 µW/K) at about 560 K and yielded a value ~20 µW/K at ~800 K.

Figure 18:
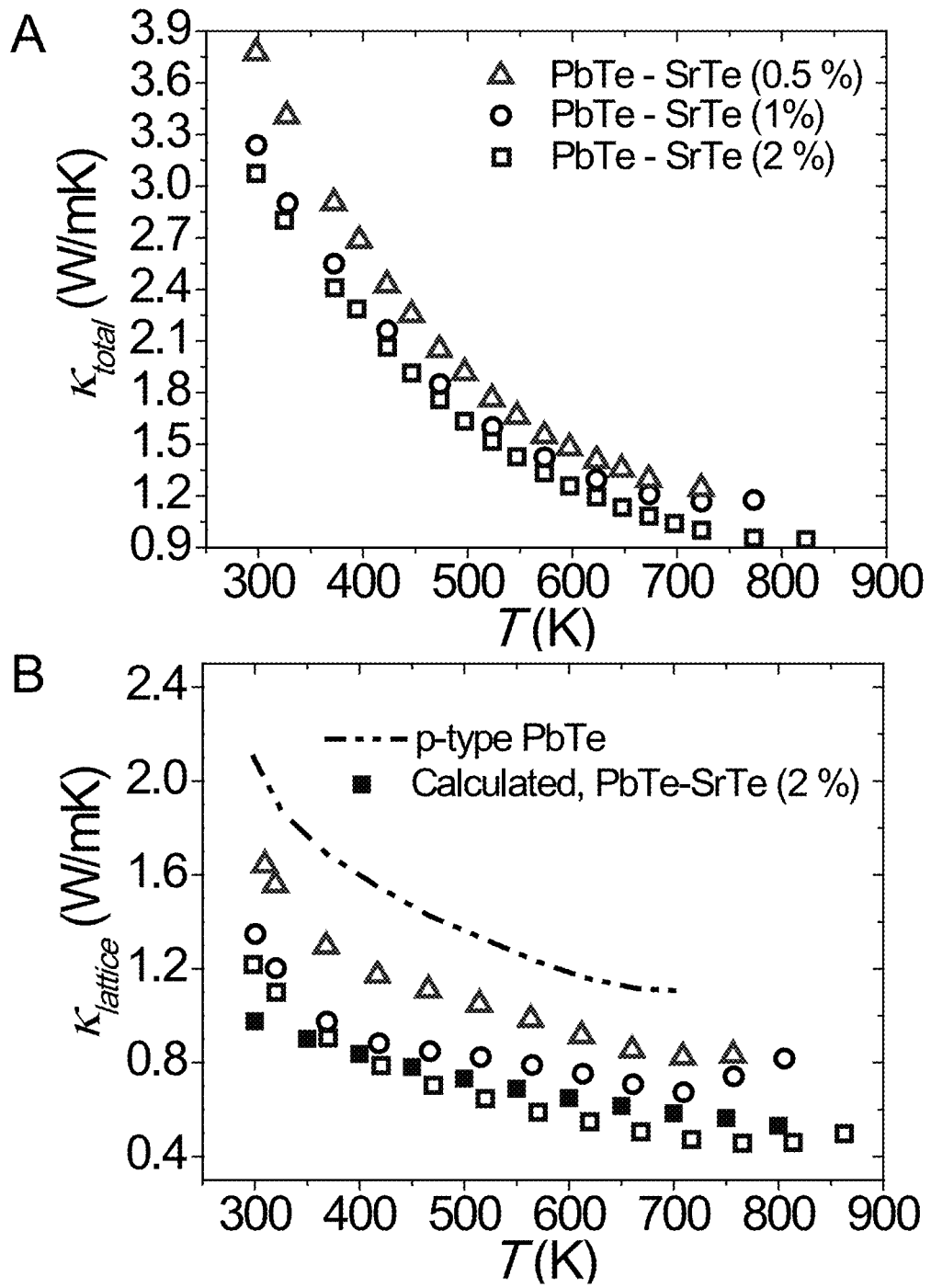
FIG. 18. Temperature dependence of (A) total thermal conductivity ($\kappa_{total}$) and (B) lattice thermal conductivity ($\kappa_{lattice}$) different PbTe—SrTe samples doped with 1 mol. % $Na_2Te$. The dotted black line in (B) is the temperature dependent lattice thermal conductivity of the state-of-the-art PbTe doped with 1 mol. % $Na_2Te$ for comparison. The solid squares in (B) show the temperature dependent lattice thermal conductivity calculated based on the Callaway model and some input parameters obtained from TEM investigation for PbTe—SrTe (2 mol. %) doped with 1 mol. % $Na_2Te$.

The thermal conductivity, $\kappa_{total}$, values of PbTe—SrTe samples as a function of temperature are shown in FIG. 18A. The lowest room temperature $\kappa_{total}$ of ~3 W/mK was observed for a 2 mol. % SrTe containing sample and it decreased down to 0.9 W/mK at ~800 K. The lattice thermal conductivity, was obtained by subtracting the electronic part, $\kappa_e$ ($\kappa_e$ can be calculated using the Wiedemann-Franz law, $\kappa_e = \sigma T L_o$, assuming the Lorenz number, $L_o = 2.44 \times 10^{-8}$ $W\Omega K^{-2}$ corresponding to a degenerate system), from the $\kappa_{total}$. FIG. 18B shows the temperature dependent $\kappa_{lat}$ for 0.5, 1, and 2 mol. % SrTe containing PbTe and standard p-type PbTe for comparison. The 2 mol. % SrTe containing sample exhibited the lowest room temperature $\kappa_{lat}$ of ~1.2 W/mK which at ~800 K dropped to the very low value of ~0.45 W/mK. The latter value represents only about 45% that of pure PbTe (FIG. 18B).

Figure 20:
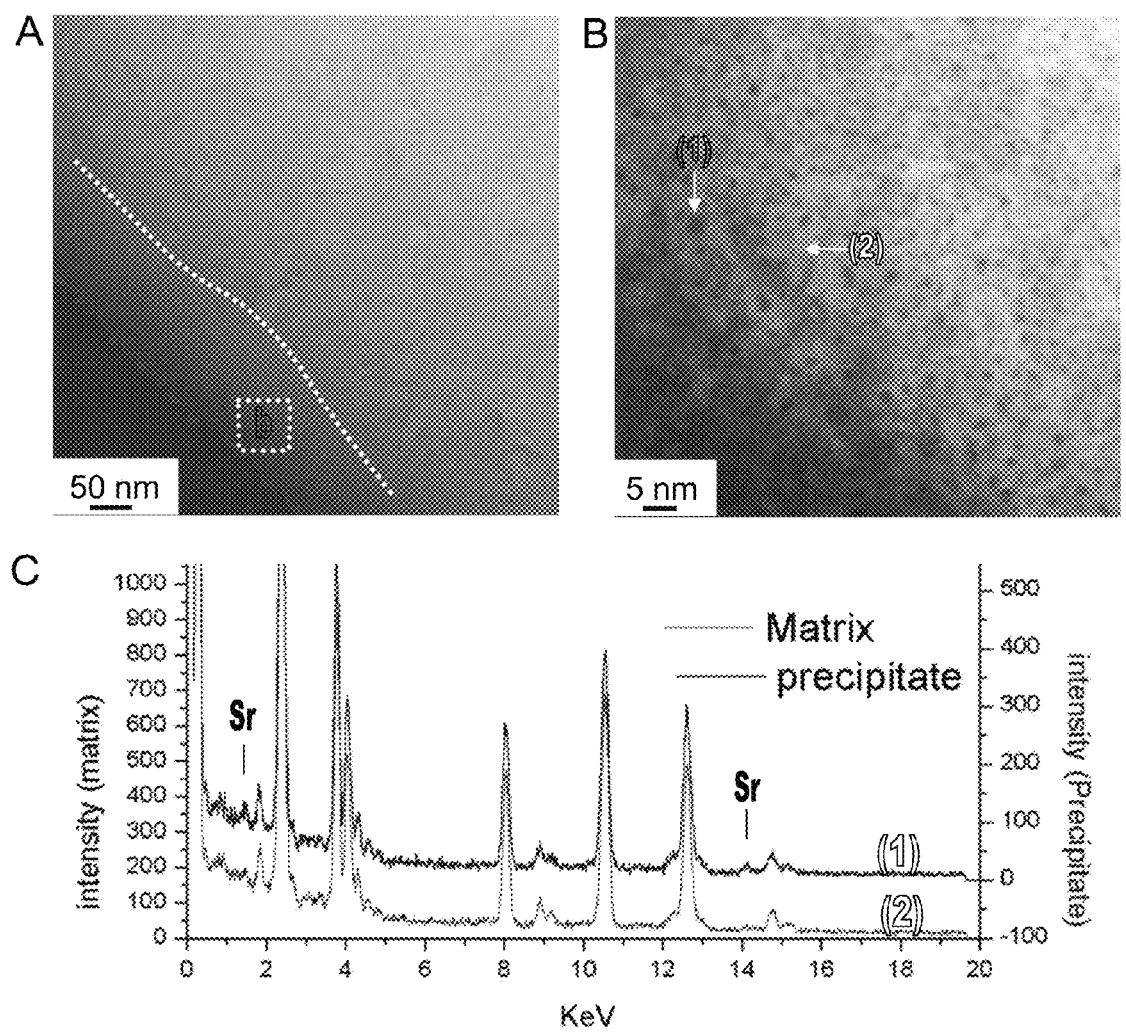
FIG. 20. (A) Low and (B) High resolution scanning transmission electron microscopy (STEM) images of PbTe—SrTe (2 mol. %) doped with 1 mol. % $Na_2Te$ sample, from Example 3. (C) Comparison of EDS between the precipitate and matrix.

Transmission electron microscopy (TEM) investigations of PbTe—SrTe samples doped with 1 mol. % $Na_2Te$ showed the presence of nanoscale precipitates with the lowest and the highest nanoparticle density in the 0.5 and 2 mol. % SrTe samples, respectively. Most of the precipitates in the samples had spherical or ellipsoidal shapes. FIGS. 19A and B show typical low magnification TEM images of 1 mol. % and 2 mol. % SrTe containing samples. Both images show many regular precipitates with dark contrast in the range of 5-15 nm. From the single electron diffraction pattern shown in the inset of FIG. 19B, it can be concluded that the PbTe matrix and SrTe nanocrystals have similar structure and lattice parameters and their lattices are completely aligned. Indeed, PbTe and SrTe, have similar lattice parameters of 6.453 and 6.660 Å, respectively. Therefore, the SrTe nanocrystals are endotaxially placed in the PbTe matrix. Further, scanning transmission electron microscopy (STEM) investigations showed the presence of numerous small precipitates, (~1-2 nm), in the so-called homogeneous region close to the edge (FIGS. 20A and B). Although it is difficult to quantitatively determine the compositions of precipitates due to their overlap with the matrix, energy dispersion x-ray spectroscopy (EDS) indicated an increase in the Sr signal from the precipitates (dark areas in the STEM image) compared to the matrix regions (FIG. 20C). The presence of SrTe nanoprecipitates in the PbTe matrix was also confirmed by an additional TEM analysis of two samples PbTe—SrTe 2 mol. % (without $Na_2Te$) and PbTe—$Na_2Te$ 1 mol. % (without SrTe). This TEM study revealed that the precipitate number densities in PbTe—SrTe 2 mol. % and in PbTe—SrTe 2 mol. %-$Na_2Te$ 1 mol. % are quite similar, whereas the Sr-free PbTe—$Na_2Te$ 1 mol. % sample contains very few detectable precipitates. FIG. 19C shows the size distribution histogram of SrTe nanocrystals for the 1 mol. % and 2 mol. % SrTe containing samples under the same TEM observation volume. It is clear that the PbTe—SrTe 2 mol. %-$Na_2Te$ 1 mol. % sample has approximately double the precipitate density of the PbTe—SrTe 1 mol. %-$Na_2Te$ 1 mol. % sample. On average, the estimates of the distribution density and size of all types of nanoscale precipitates are ~$5 \times 10^{11}$/cm$^2$, and ~2 nm for PbTe—SrTe 2 mol. %-$Na_2Te$ 1 mol. %, respectively. Although the SrTe precipitates have a broad size distribution (e.g., ~1-15 nm), for simplicity an average particle size of 2 nm was used in the calculation of the lattice thermal conductivity.

In order to analyze the defects or strain distribution at the boundaries between the precipitates and the PbTe matrix, high resolution TEM investigations were preformed on PbTe—SrTe 2 mol. %-$Na_2Te$ 1 mol. %. FIG. 19D shows a typical lattice image of a 10 nm size precipitate in the sample with a typical interfacial boundary (~2 nm dark contrast) between the matrix and the precipitate. In FIG. 19E, the Inverse Fast Fourier Transform (IFFT) image of the precipitate depicts four dislocation cores at the boundary. The Burger's circuit around the dislocation core in FIG. 19D yields a closure failure with a projected vector ½ a[010]. To analyze the plastic strain around dislocations or possible elastic strain, this image was studied by geometric phase-analysis (GPA), which is a lattice image processing method for strain field analysis. GPA was used to investigate the variation in the lattice parameter and thus the strain at/around the boundaries. To reduce the artifacts of the strain analysis, it is necessary to obtain and use high quality, clear lattice images. FIGS. 19F and G are the strain map profiles along the 110 ($\epsilon_{xx}$) and 001 direction ($\epsilon_{yy}$), respectively. FIG. 19G clearly shows four highly strained dislocation cores which are in agreement with FIG. 19E. From the strain map distribution of this image, it appears that no elastic strain was present except for plastic strains around dislocation cores. That means the dark contrast at the boundary between the precipitate and matrix is diffraction contrast rather than elastic strain. Many misfit dislocations appear in almost observable precipitates in PbTe—SrTe 2 mol. %-$Na_2Te$ 1 mol. % sample; which means that the density of dislocations is about three times as high as the number density of SrTe nanocrystals.

To understand the role of the SrTe nanocrystals in reducing the lattice thermal conductivity of PbTe—SrTe 2 mol. %-$Na_2Te$ 1 mol. %, theoretical calculations of the lattice thermal conductivity based on the Callaway model were performed. The lattice thermal conductivity is given by:

$$\kappa_{lat} = \frac{k_B}{2\pi^2 v}\left(\frac{k_B T}{\hbar}\right)^3 \left\{\int_0^{\theta_D/T} \tau_c \frac{x^4 e^x}{(e^x-1)^2}\, dx + \frac{\left[\int_0^{\theta_D/T} \frac{\tau_c}{\tau_N}\frac{x^4 e^x}{(e^x-1)^2}\, dx\right]^2}{\int_0^{\theta_D/T} \frac{1}{\tau_N}\left(1-\frac{\tau_c}{\tau_N}\right)\frac{x^4 e^x}{(e^x-1)^2}\, dx}\right\}$$

where $k_B$ is the Boltzmann's constant, $\hbar$ is the Plank constant, T and $\theta_D$ are, respectively, the absolute temperature and the Debye temperature, $\upsilon$ is an average phonon-group velocity, $x = \hbar\omega/k_B T$, $\tau_N$ is relaxation time due to normal phonon-phonon scattering and $\tau_c$ is the combined relaxation time. The latter is obtained by integrating the relaxation times from various processes. Based on TEM studies, for a certain frequency, the relaxation time depends mainly on scattering from the nanoscale precipitates, dislocations, boundaries, and the phonon-phonon interactions. The overall relaxation time is then:

$$\tau_c^{-1} = \tau_U^{-1} + \tau_N^{-1} + \tau_B^{-1} + \tau_D^{-1} + \tau_P^{-1}$$

where $\tau_U$, $\tau_N$, $\tau_B$, $\tau_D$, and $\tau_P$, are the relaxation times corresponding to scattering from Umklapp processes, normal processes, boundaries, dislocations, and precipitates. Based on these formulae and the parameters obtained from the TEM observations, the lattice thermal conductivity of PbTe—SrTe 2 mol. %-Na₂Te 1 mol. % was calculated. The results are shown in FIG. 18B and match the experimental data reasonably well, although the temperature dependence near room temperature is somewhat weaker than the experimental data indicate. These calculations indicate the endotaxial nanoscale precipitates play a more important role than other possible mechanisms in reducing the lattice thermal conductivity.

Figure 21:
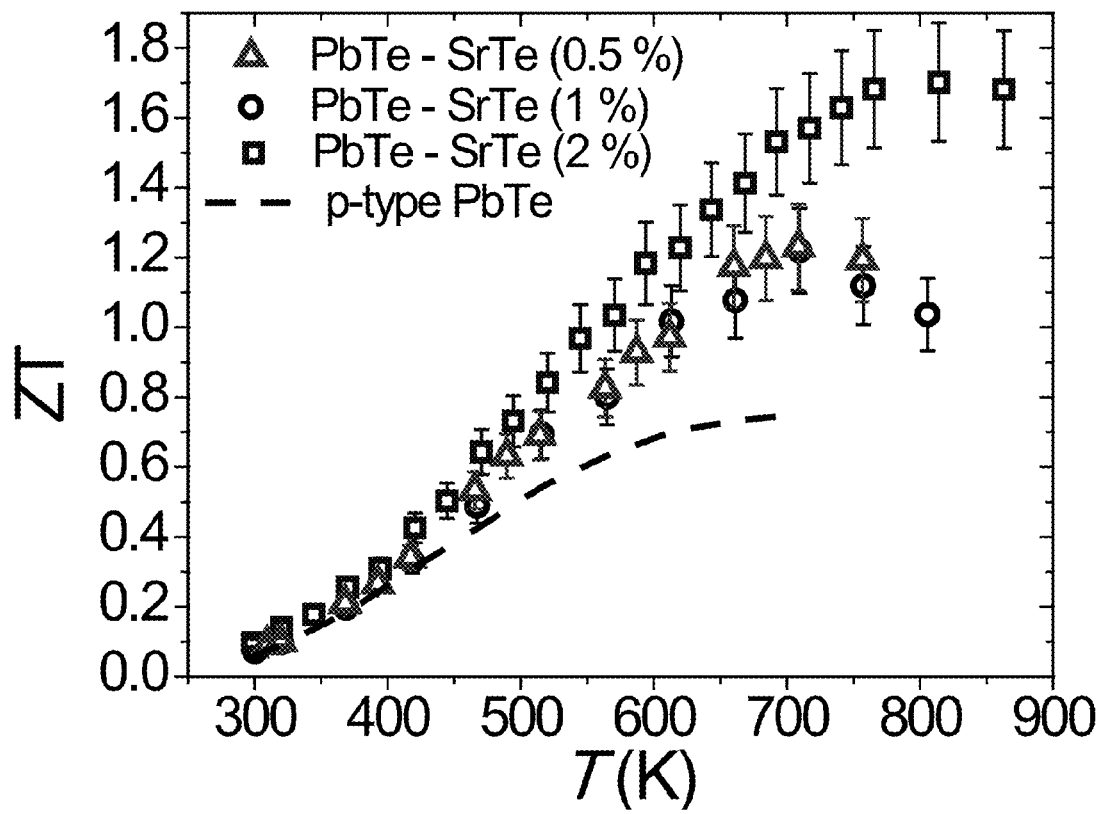
FIG. 21. The thermoelectric figure of merit (ZT) as a function of temperature (with error bars) for different PbTe—SrTe samples doped with 1 mol. % $Na_2Te$. The dotted black line represents the temperature dependent ZT of state-of-the-art p-type PbTe for comparison.

FIG. 21 presents the obtained ZT values as a function of temperature for different PbTe—SrTe samples doped with 1 mol. % Na₂Te. For comparison, ZT data for pure but optimized p-type PbTe is also included for comparison. The highest ZT achieved was 1.7 (with 10% error bar) at 815 K for a 2 mol. % SrTe containing PbTe sample. This material maintains the figure of merit above unity over a wide temperature range above 550 K.

Summary.

Superior thermoelectric properties in p-type PbTe—SrTe have been achieved through targeted nanostructure engineering that creates coherently placed nanoinclusions within the matrix. The nanoinclusions do not reduce the electrical power factor and function exclusively as phonon scattering entities to reduce the lattice thermal conductivity to the exceptionally low level of 0.45 W/mK, at 800 K.

Example 4

PbTe—PbSnS₂

Stock PbTe, SnTe, and PbS materials were synthesized using high-purity Pb (99.99%, American Elements), Te (99.999%, Atlantic Metals), S (99.98%, Aldrich) and Sn (99.999%, Atlantic Metals) by flame-sealing the starting elements into fused silica ampoules under a residual pressure of ~10⁻⁴ Torr and reacting at a temperature at least 50° above the melting point in high-temperature furnaces. PbTe—PbSnS₂ was synthesized by stoichiometric addition of appropriate quantities of PbTe, SnTe, and PbS using the same method. Certain samples were doped with 0.055 mol. % PbI₂ n-type dopant (99.999%, Aldrich). For example, synthesis of ~8 g PbTe—PbSnS₂ 6 mol. %+0.055 mol. % PbI₂ would require 6.7932 g PbTe, 0.3657 g SnTe, 0.7105 g PbS, and 0.0063 g PbI₂. All samples were held at 1050° C. for approximately 8 h, inverted several times at the melt to ensure complete mixing, and rapidly cooled from the melt. The resulting ingots were sectioned using a circular wire saw and polished using a Buehler Isomet grinder/polisher.

Powder X-Ray Diffraction.

Finely ground samples were placed in an Inel CPS-120 X-ray powder diffractometer using Ni-filtered Cu K$_\alpha$ radiation ($\lambda$=1.54056 Å) in reflection geometry, equipped with a position sensitive detector and operating at 40 kV and 20 mA.

Electrical Transport.

Electrical conductivity and thermopower were measured on polished parallelpipeds with dimension of approximately 2×2×8 mm in an ULVAC ZEM-3 electrical conductivity and Seebeck coefficient system. Samples were sandwiched between two Ni electrodes with two probe thermocouples providing forced contacts on one side. The sample chamber was evacuated and back-filled with approximately 0.1 atm He, and heated from room temperature to 400° C. using an IR furnace. Electrical conductivity was measured using a standard 4-point probe technique. The Seebeck coefficient was calculated by measuring average induced voltage resulting from temperature gradients of 5, 10, and 15 K provided by resistive Pt coils located beneath one electrode.

Thermal Conductivity.

Thermal diffusivity and specific heats of the samples were measured on a Netzsch LFA 457. Coins measuring approximately 8 mm in diameter by 2 mm in thickness were heated from room temperature to 400° C. Total thermal conductivity was calculated using the equation $\kappa_{tot}=\alpha C_p d$, where $\kappa_{tot}$ is total thermal conductivity, a is thermal diffusivity, $C_p$ is specific heat, and d is density. Density was calculated from the sample dimensions and mass, and $C_p$ was calculated relative to a Pyroceram 9606 reference. The electronic contribution to total thermal conductivity $\kappa_{elec}$ was calculated using the Wiedemann-Franz law, $\kappa_{elec}=\sigma T L_0$ (where $\sigma$=electrical conductivity, T=temperature, and $L_0$=2.45·10⁻⁶ w/cm²K²Ω). The lattice component $\kappa_{lat}$ was then calculated using the relation $\kappa_{lat}=\kappa_{tot}-\kappa_{elec}$.

Scanning Electron Microscopy (SEM).

The microstructures of finely-polished sample surfaces were observed and indentified using a Hitachi 53400 SEM equipped with an back-scattered electron (BSE) detector operating at 20 kV voltage and 15 μA current at a working distance of 10 mm. Differences in phase composition were successfully identified using energy dispersive X-ray spectroscopy (EDS) analysis using the program Inca.

High-resolution images of different phases were observed using a FEI Helios Nanolab FIB/SEM. Imaging using the electron beam was accomplished at 5 kV voltage with a 98 pA current, while milling using the ion beam was accomplished at 30 kV voltage with 2.8 nA current. Areas of the sample were bombarded with Ga⁺ ions, resulting in preferential etching of the sample along grain boundaries and differing phases. The resulting image provides a more clear representation of the microstructure, with minimized appearance of surface defects and scratches.

Transmission Electron Microscopy (TEM).

Samples were thinned to electron-transparent foils using both a conventional polishing method as well as through preparation in the FIB/SEM. Images were obtained using a JEOL JEM 2200FS (field emission TEM) operating at 200 kV using a double-tilt holder.

Structural Characterization.

Figure 22:
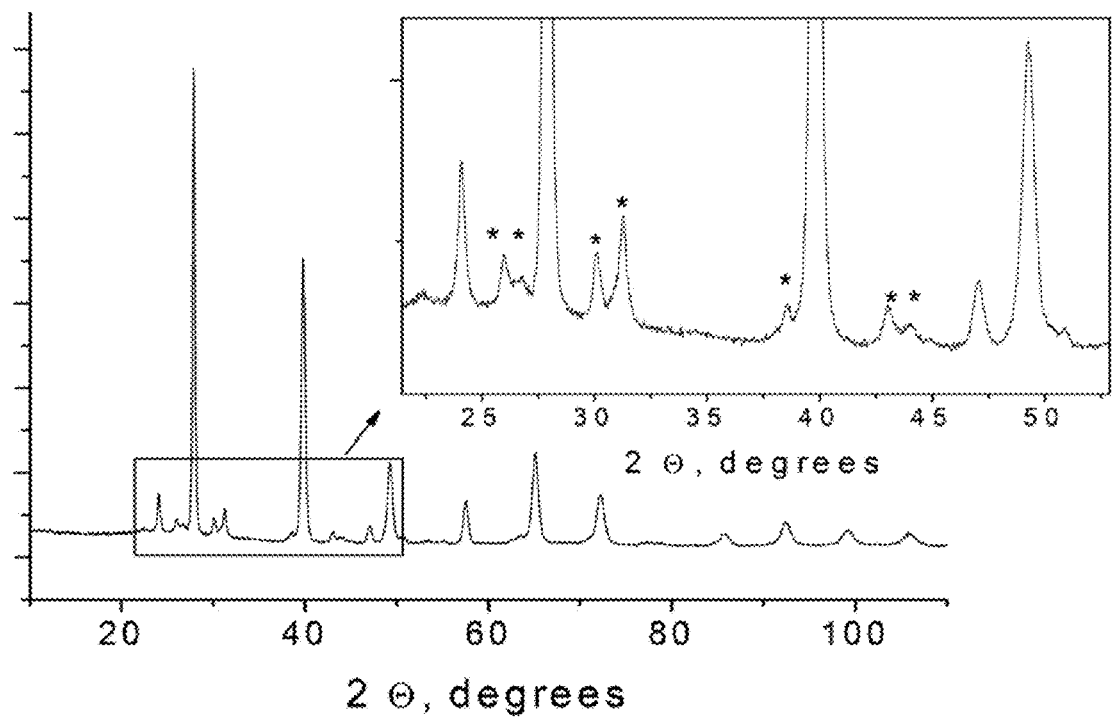
FIG. 22. Powder X-Ray diffraction pattern of PbTe—$PbSnS_2$ 14 mol. %. Inset: Characteristic $PbSnS_2$ are labeled using asterisk (*), all remaining peaks are characteristic PbTe reflections.

Powder X-Ray Diffraction (PXRD) analysis revealed that upon addition of appropriate amounts of PbTe, SnTe, and PbS, the binary composite PbTe—PbSnS₂ is formed. FIG. 22 shows a typical PXRD pattern with observed reflections for both PbTe and PbSnS₂.

Figure 23A:
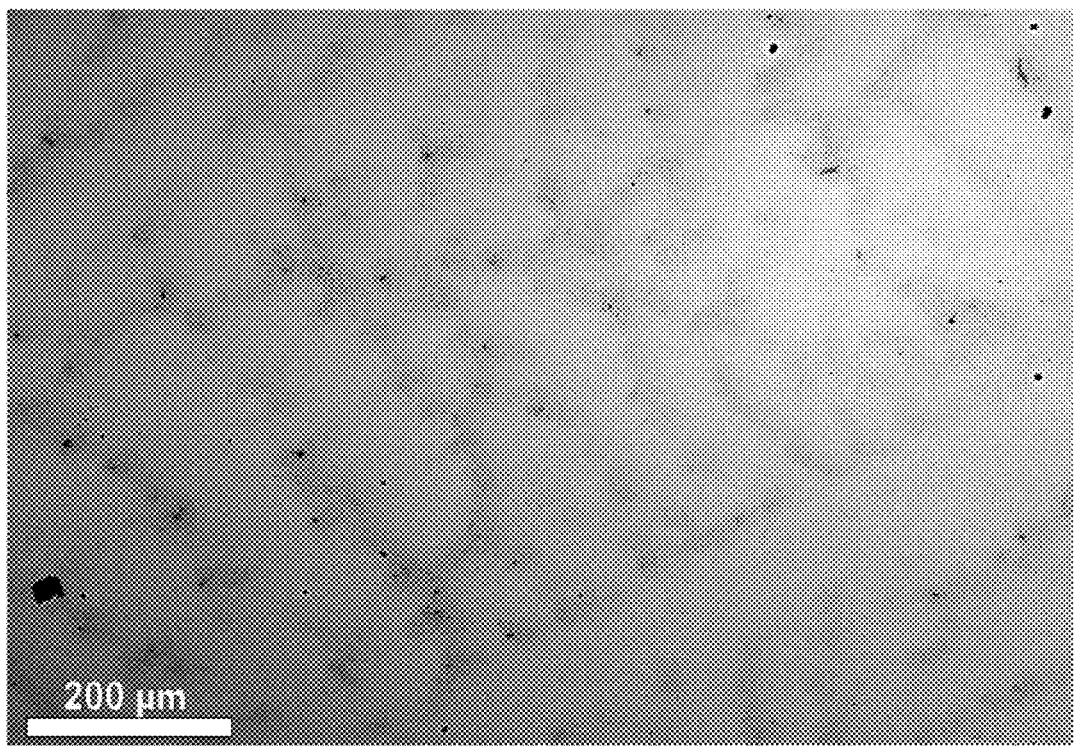
FIG. 23. a) Low-magnification SEM image showing $PbSnS_2$ networks (dark regions) extending primarily at grain boundaries of PbTe in PbTe—$PbSnS_2$ 11 mol. %, b) High-magnification SEM image showing difference in size and morphology of $PbSnS_2$ in PbTe—$PbSnS_2$ 25 mol. % (dark regions), c) Typical EDS linescan for a $PbSnS_2$ particle, showing increase in Sn and S intensity, a decrease in Te intensity, and virtually no change in Pb intensity.
Figure 23B:
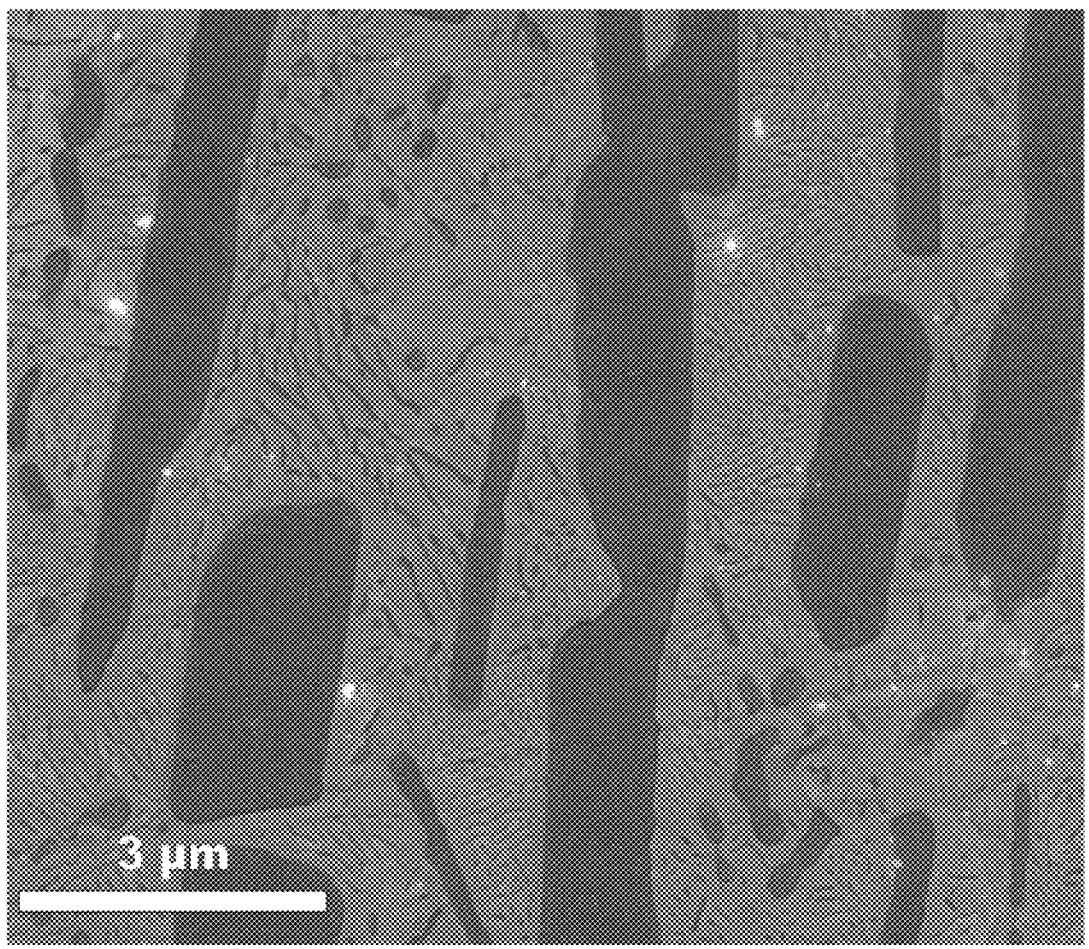
Figure 23C:
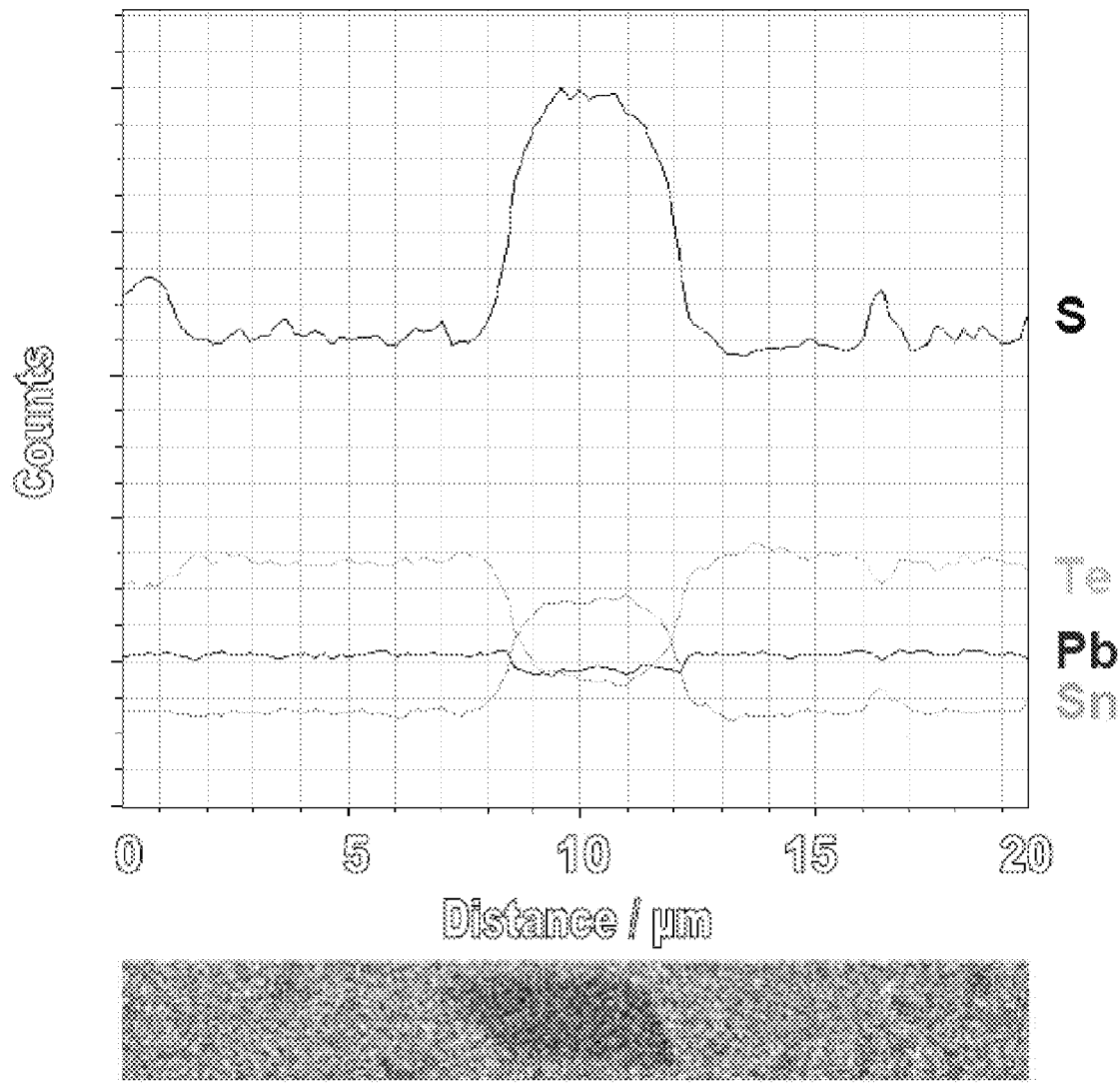

The PbSnS₂ phase appears to self-segregate into lamellar structures on cooling from the liquid phase, as evidenced by scanning electron microscopy (SEM). The lamellae appear to form predominately at the grain boundaries of PbTe-rich regions, similar to a eutectic phase relation, FIG. 23. For low concentrations of PbSnS₂ (3 and 6 mol. % compositions), particles range between 50-100 nm in width, while at high concentrations (>mol. 25%) particles range between 50 nm-25 μm in width, FIG. 23b. Energy dispersive X-ray spectroscopy (EDS) analysis reveals the precipitates to be completely Te-deficient as well as Sn-rich, FIG. 23c.

Figure 24A:
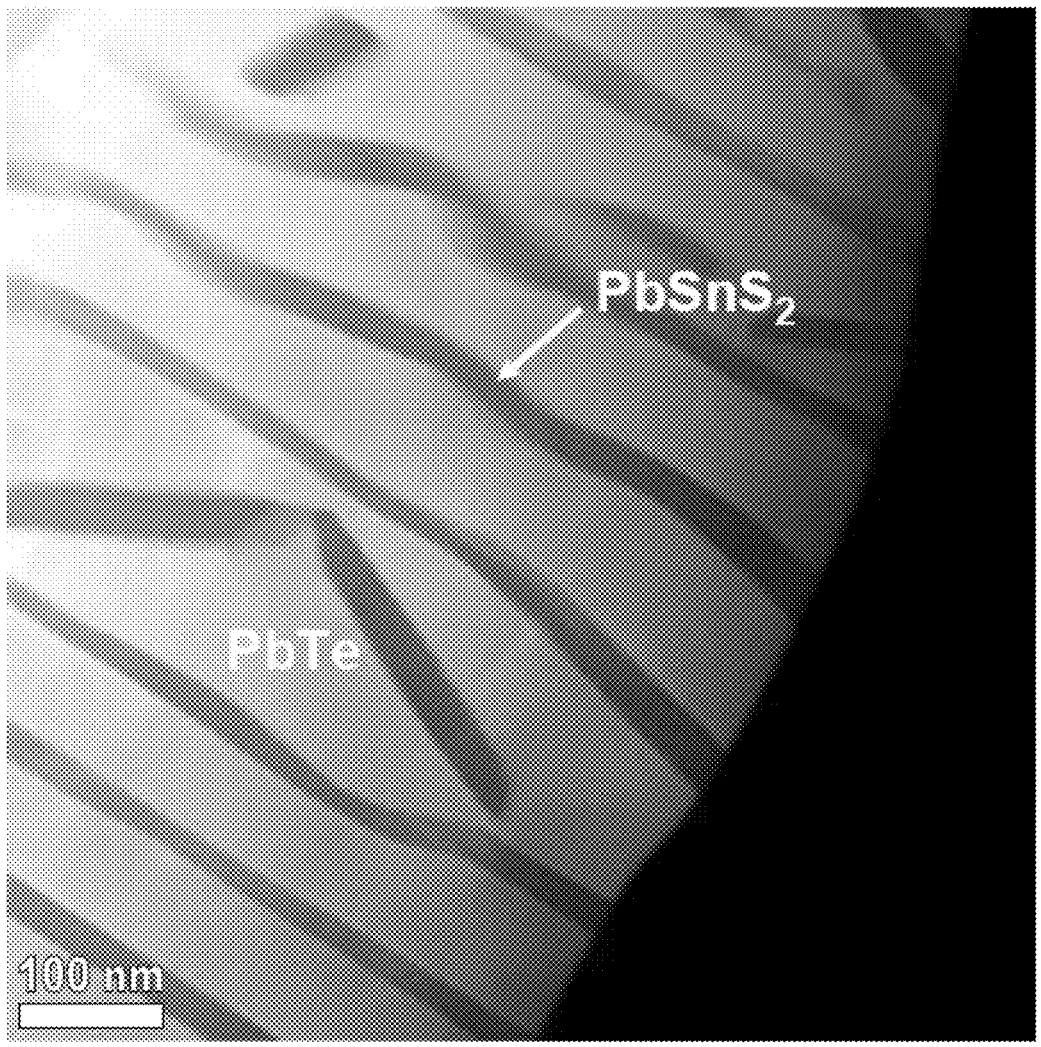
FIG. 24. a) Microstructure of the PbTe—$PbSnS_2$ composite. The $PbSnS_2$ phase (dark areas) assemble into rod-like structures approximately 50 nm in width and extend microns in length; b) HRTEM image of the PbTe—$PbSnS_2$ interface. The layered structure of $PbSnS_2$ can be clearly observed. The two phases are completely coherent, as shown in the selected area electron diffraction (SAED), inset; c) HRTEM image of $PbSnS_2$ in the [011] direction shows superstructure of $PbSnS_2$ along the c axis. Each bilayer is approximately 0.6 nm in thickness. The crystal structure of the $PbSnS_2$ can be clearly observed, as compared with a model.
Figure 24B:
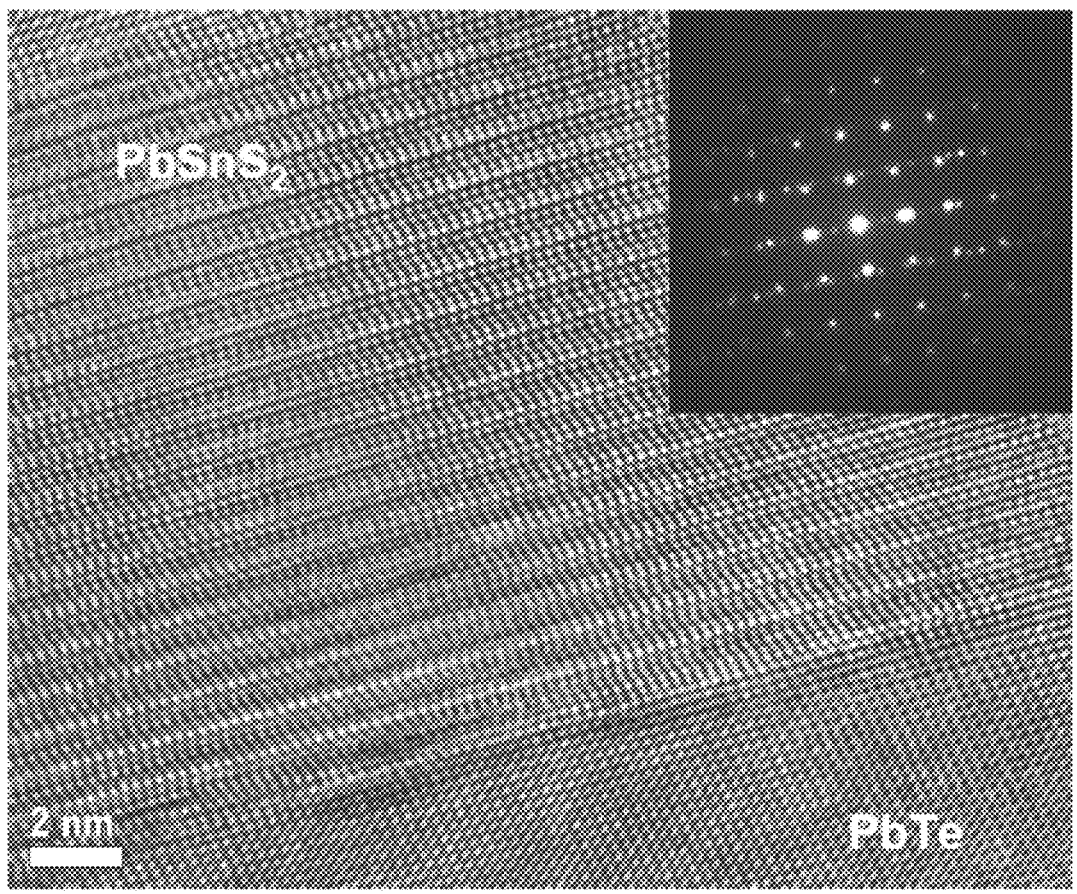
Figure 24C:
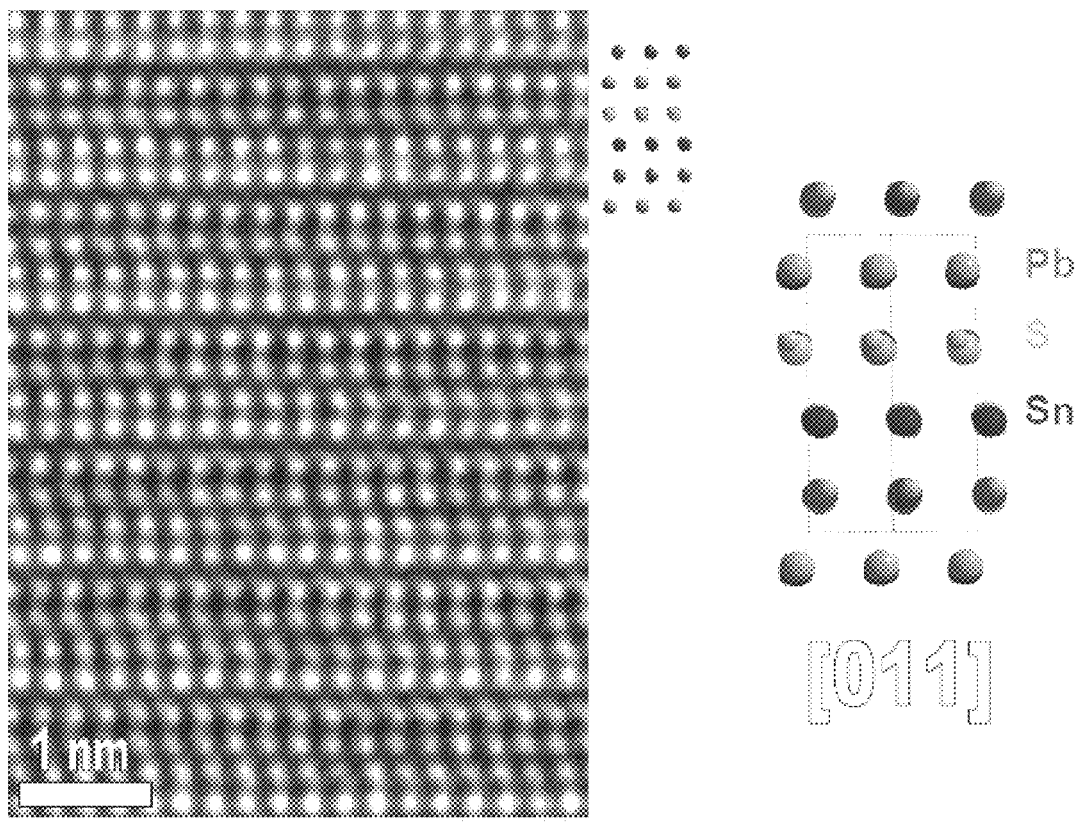
Figure 25A:
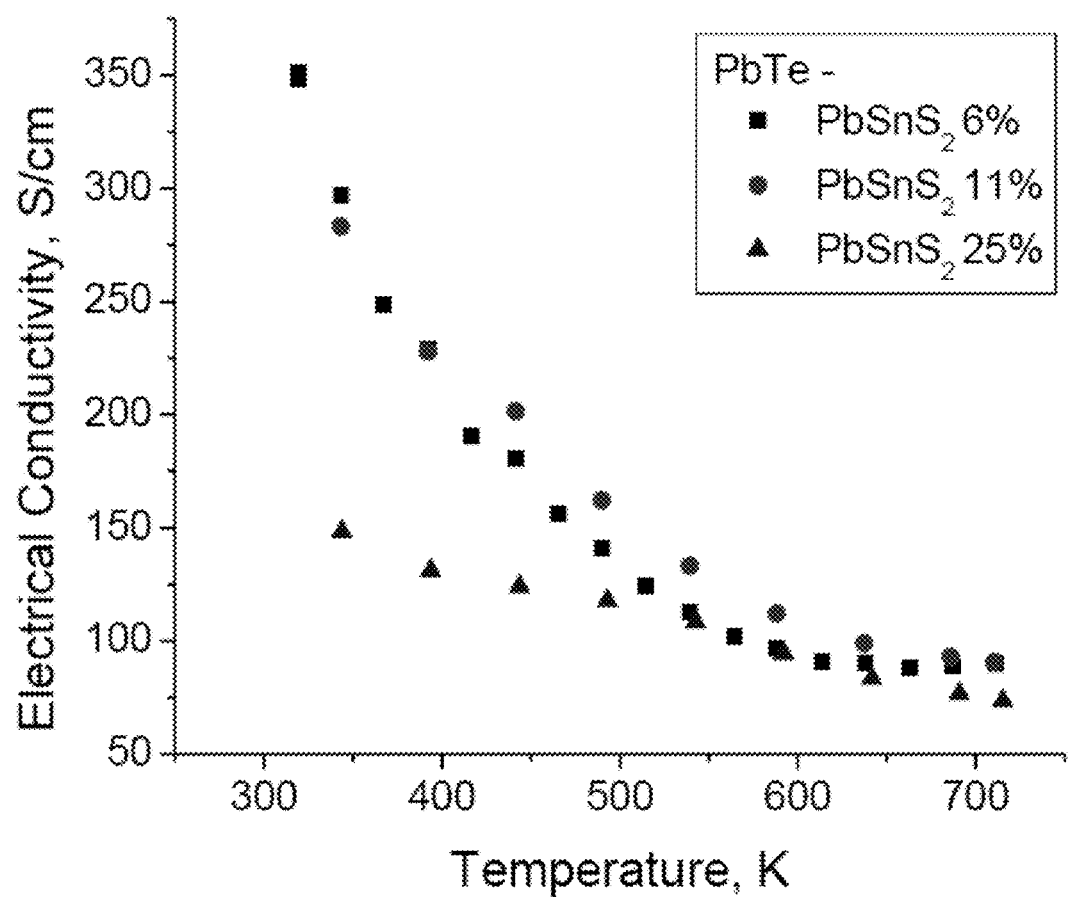
FIG. 25. Temperature-dependent thermoelectric properties of undoped PbTe—$PbSnS_2$ samples: a) electrical conductivity, b) thermopower, c) power factor, d) lattice thermal conductivity, e) ZT.
Figure 25B:
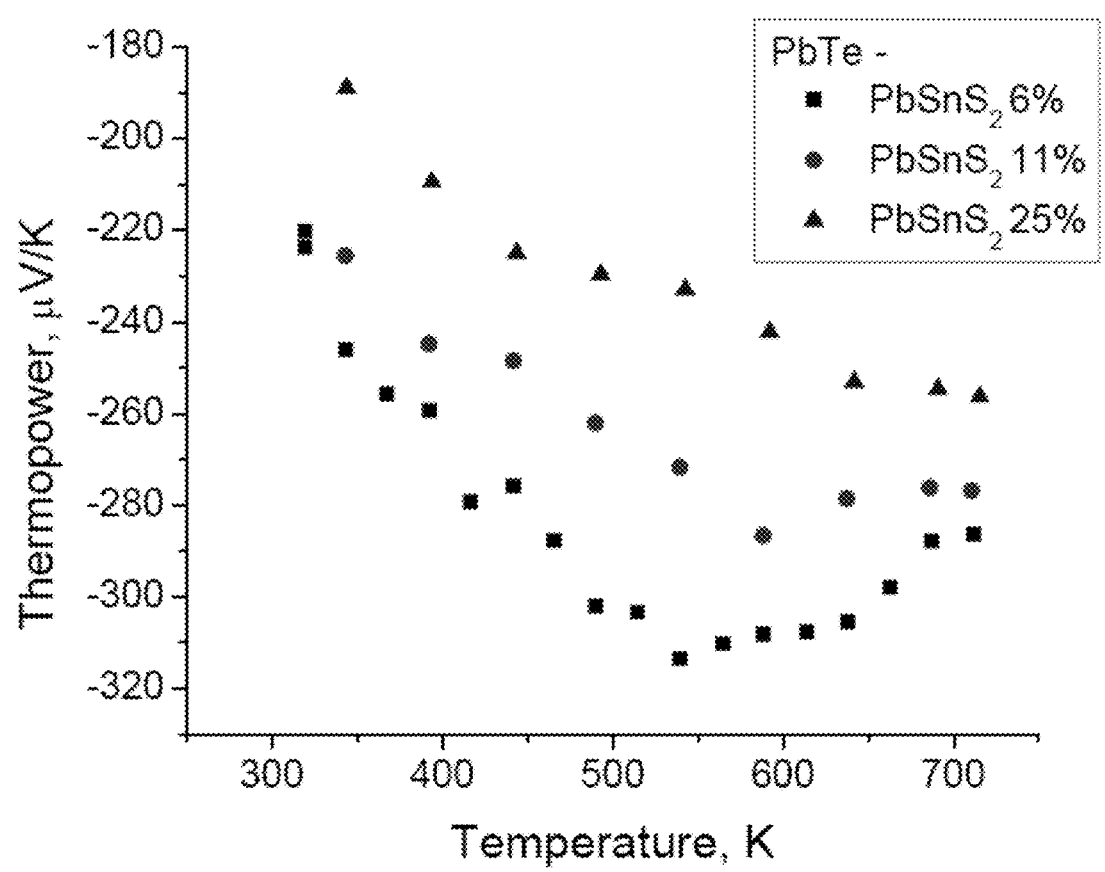
Figure 25C:
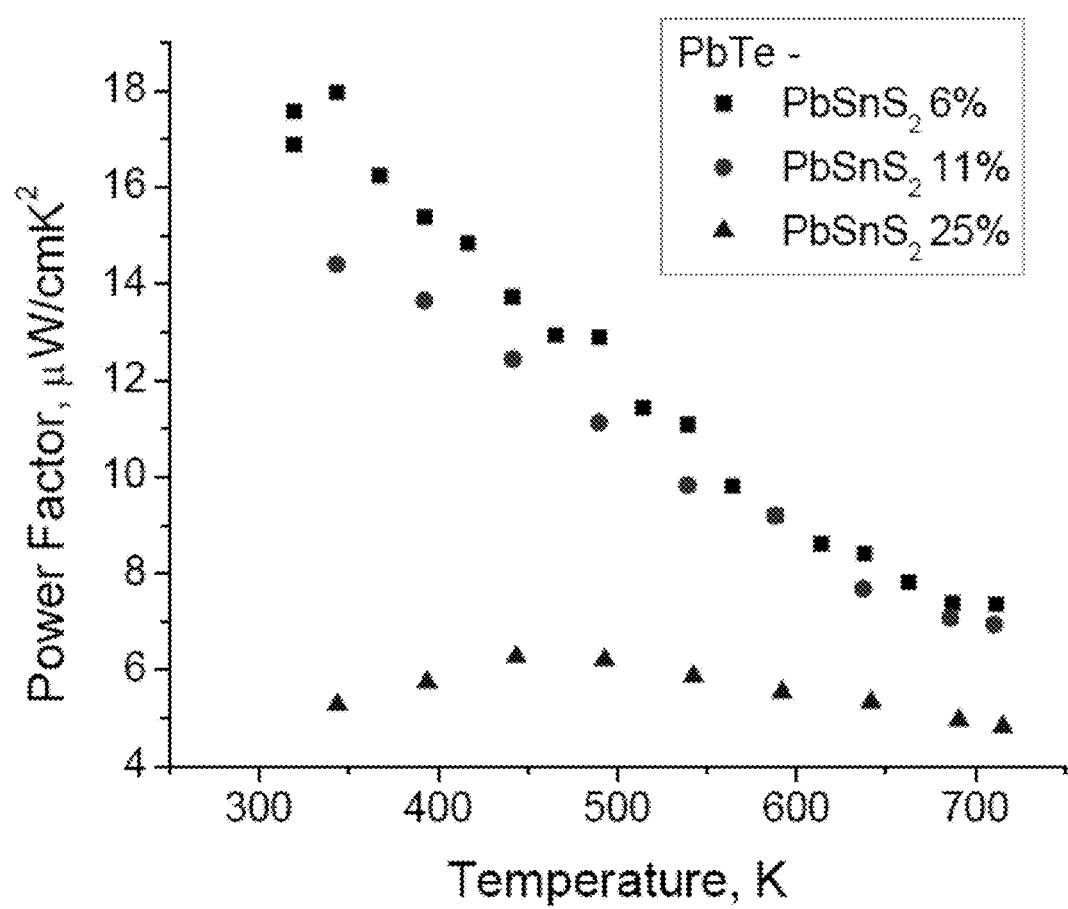
Figure 25D:
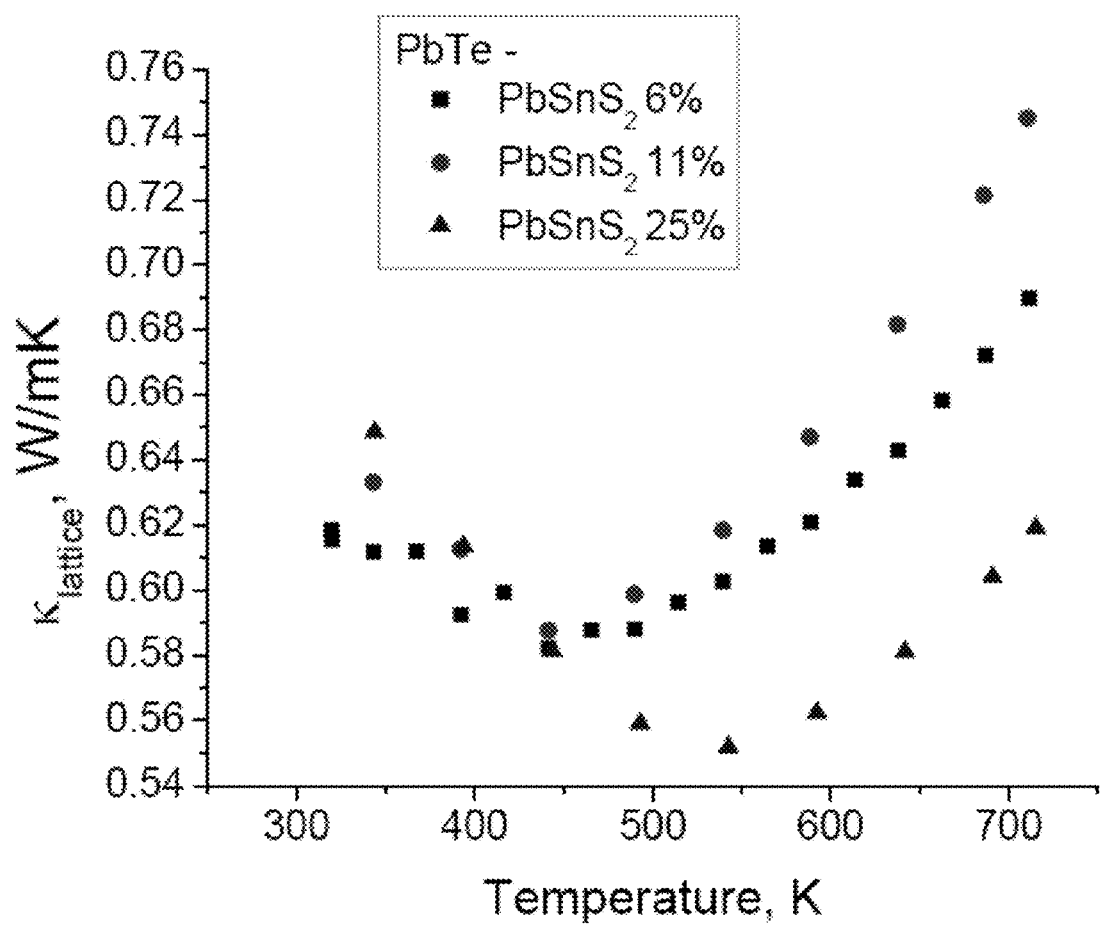
Figure 25E:
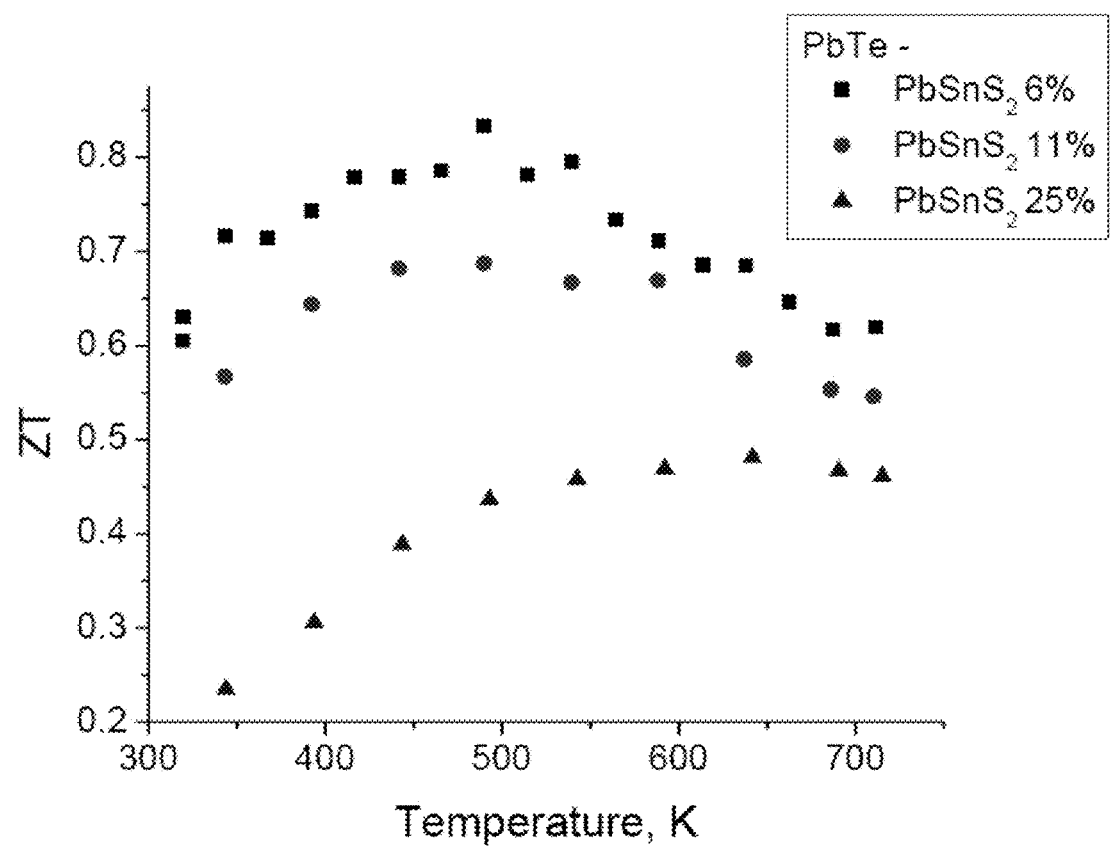
Figure 26A:
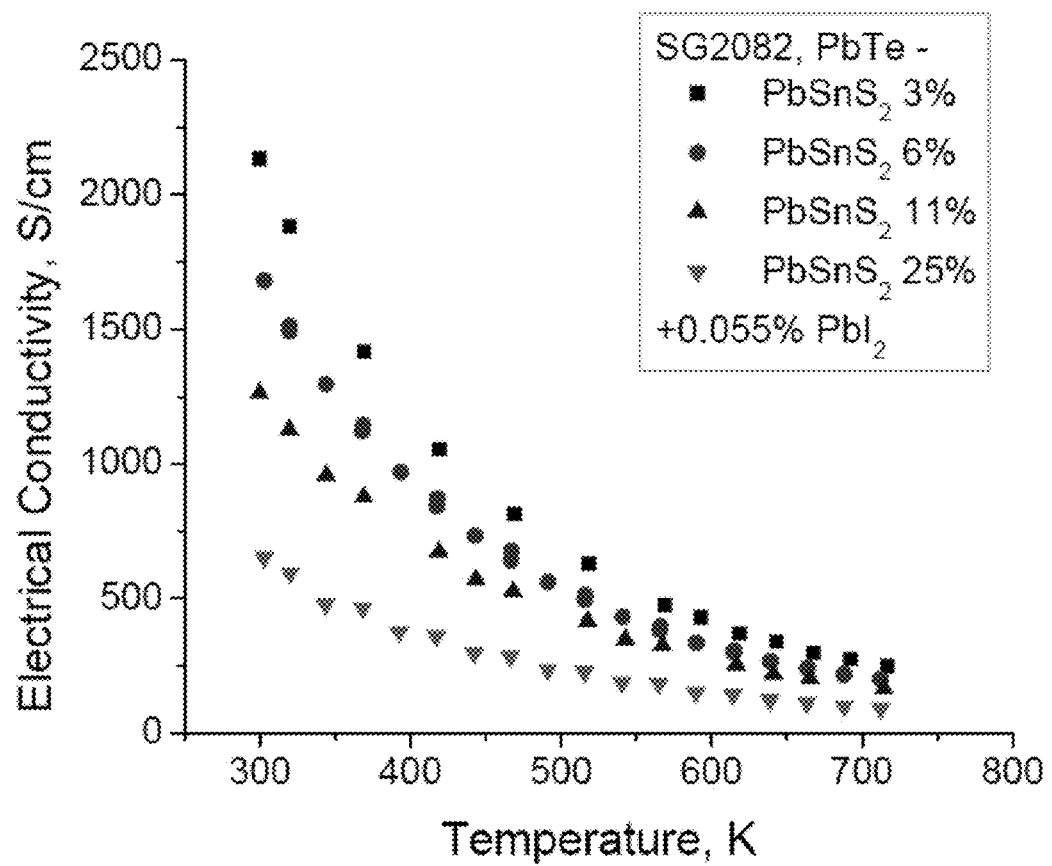
FIG. 26. Temperature-dependent thermoelectric properties of PbTe—$PbSnS_2$ samples doped with 0.055 mol. % $PbI_2$: a) electrical conductivity, b) thermopower, c) power factor, d) lattice thermal conductivity, e) ZT.
Figure 26B:
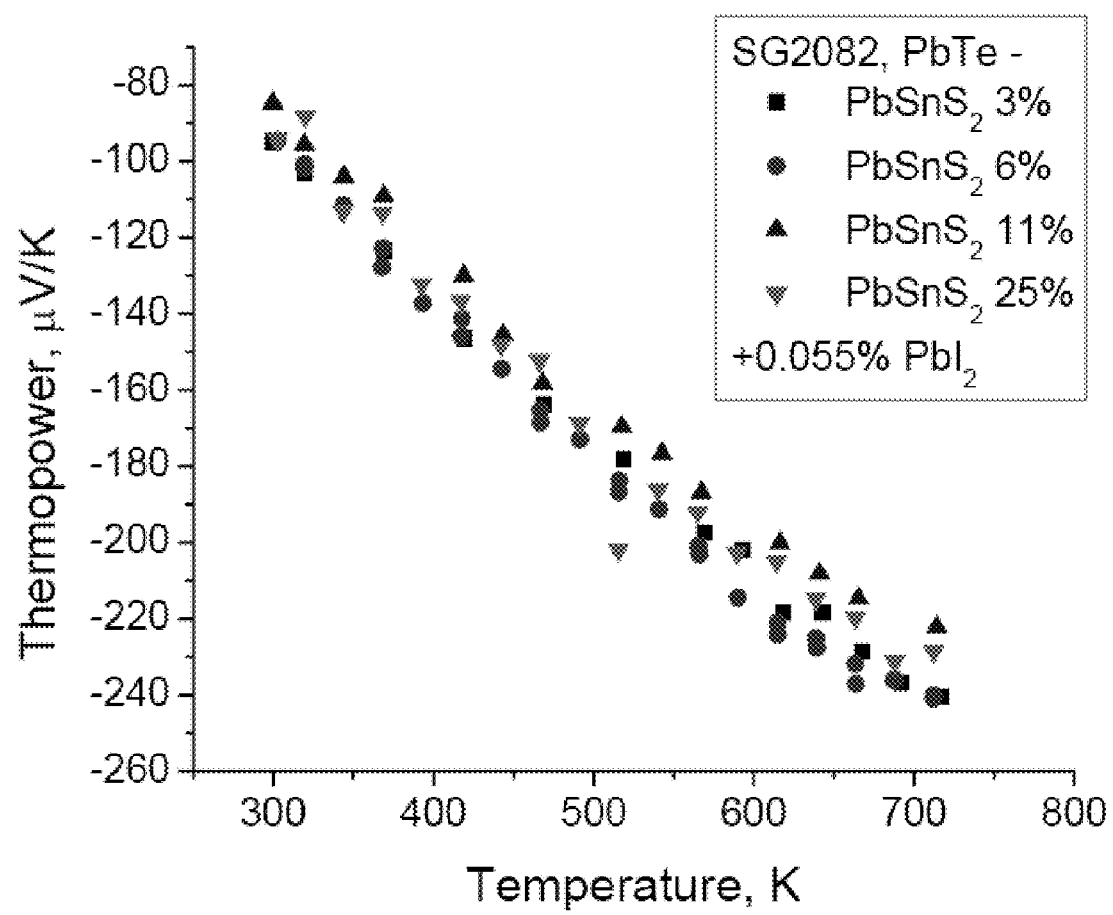
Figure 26C:
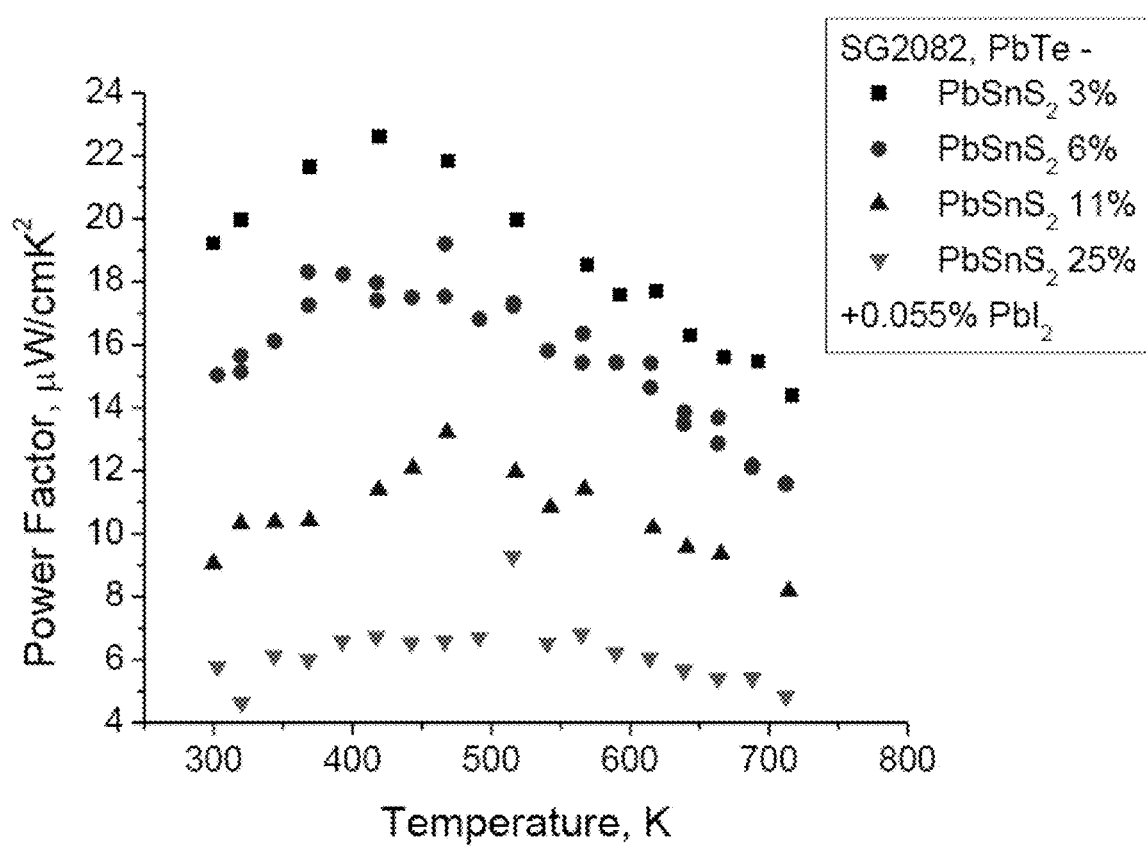
Figure 26D:
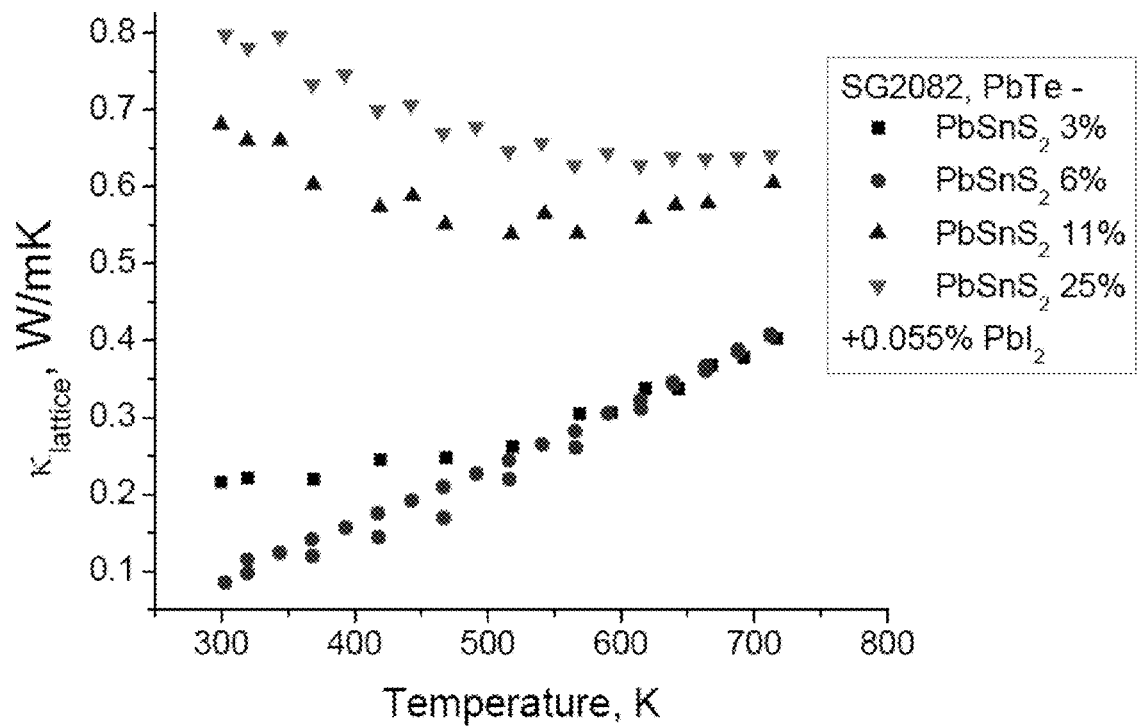
Figure 26E:
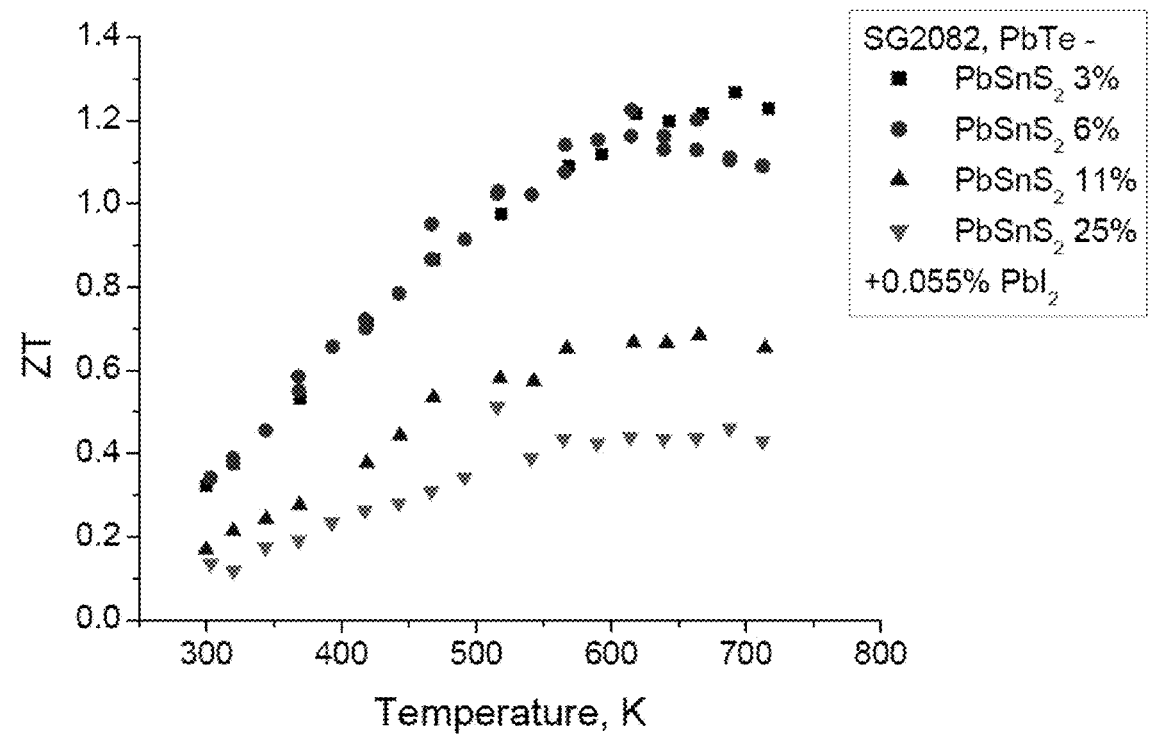

High-resolution transmission electron (HRTEM) microscopy reveals the extended superstructure of the PbSnS₂ phase, FIG. 24. The PbSnS₂ phase appears to self-assemble into rod-like lamellae 50-100 nm in width spaced 100-200 nm apart in the PbTe matrix, FIG. 24a. Atomic-resolution images clearly show the extended superstructure of the Pb—Sn bilayers throughout the lamellae, FIG. 24b. Selected area electron diffraction (SAED) shows the PbSnS₂ to be almost completely coherent in PbTe. Each Pb—Sn bilayer is approximately 0.6 nm in thickness, agreeing closely with previous literature, FIG. 24c. While the superstructure may scatter low-energy charge carriers, the size of the bilayers are particularly well-suited to scatter high-energy acoustic phonons, whose wavelengths are generally around 1-2 nm in the temperature range 300-700 K.

Thermoelectric Properties.

Undoped samples of PbTe—PbSnS$_2$ show n-type conduction, a relatively high thermopower, and low electrical conductivity at room temperature, FIG. 25. The PbTe—PbSnS$_2$ 6 mol. % sample exhibits optimal properties of the undoped samples, with a room temperature power factor of ~18 µW/cmK$^2$, FIG. 25c. Lattice thermal conductivity was calculated using the total thermal conductivity $\kappa_{tot}$ (assuming $\kappa_{tot}=\kappa_{elec}+\kappa_{lat}$) and electronic contribution to thermal conductivity $\kappa_{elec}$ (as defined by the Wiedemann-Franz law, $\kappa_{elec}=L_0\sigma T$ using $L_0=2.45\cdot10^{-6}$ W/cm$^2$K$^2\Omega$). The corresponding lattice thermal conductivity is extremely low for each sample, between 0.55-0.74 W/mK over the entire temperature range, FIG. 25d. As a result, the room temperature ZT of the PbTe—PbSnS$_2$ 6 mol. % sample is approximately 0.65, an excellent value for a PbTe-based system, with a maximum of 0.8 at 500 K, FIG. 25e. The enhancement in ZT appears to be almost exclusively related to the significant reduction in lattice thermal conductivity.

Samples of PbTe—PbSnS$_2$ doped n-type with 0.055 mol. % PbI$_2$ exhibit expected increases in electrical conductivity and decreased thermopower, FIG. 26. Across the composition range the thermopower does not change significantly while the electrical conductivity decreases monotonically with increasing PbSnS$_2$ concentration, varying between 2200 S/cm for PbTe—PbSnS$_2$ 3 mol. % to ~600 S/cm for PbTe—PbSnS$_2$ 25 mol. % at room temperature, FIG. 26a. The similar values of thermopower suggest similar carrier concentrations for each sample, FIG. 26b. Electrical conductivity a can be defined by $\sigma=ne\mu$, where n=carrier concentration, e=fundamental electron charge, and $\mu$=electron mobility; therefore the decrease in electrical conductivity suggests a decrease in electron mobility as PbSnS$_2$ concentration is increased. This is expressed likewise in the power factor, whose room temperature values decrease from 22 µW/cmK$^2$ for PbTe—PbSnS$_2$ 3 mol. % to 6 µW/cmK$^2$ for PbTe—PbSnS$_2$ 25 mol. %, FIG. 26c. Lattice thermal conductivity was calculated in same manner as explained above. The exceptionally low values of lattice thermal conductivity at room temperature for the PbTe—PbSnS$_2$ 3 and 6 mol. % samples is likely an artifact of the assumption for the Lorenz number $L_0$; still, the comparison between the doped and undoped samples show that the lattice thermal conductivity is impressively low, essentially approaching the amorphous limit between 0.6 and 0.2 W/mK. Excellent values of ZT for the PbTe—PbSnS$_2$ 3 mol. % sample doped with 0.055 mol. % PbI$_2$, with a maximum of 1.3 at 700 K are shown in FIG. 26e.

As shown in this example, PbSnS$_2$ is a complex layered material (space group Pnma) comprised of Sn—Pb bilayers approximately 0.6 nm in thickness. High resolution transmission electron microscopy revealed the PbSnS$_2$ segregates into fully coherent lamellar structures 50-100 nm in width that extend 100 nm-15 µm in length. Incorporation of PbSnS$_2$ in PbTe resulted in a significant reduction in lattice thermal conductivity of between 0.2-0.6 W/mK at room temperature, a reduction of almost 70% over bulk PbTe. The nanoscale superstructure of PbSnS$_2$ regions coherently embedded in PbTe served to effectively scatter phonons, even though the smallest of the PbSnS$_2$ regions was ~50 nm in width. The electron mobility was decreased with increasing PbSnS$_2$ concentration, so the highest ZT of 1.3 was observed for the PbTe—PbSnS$_2$ 3 mol. % sample.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

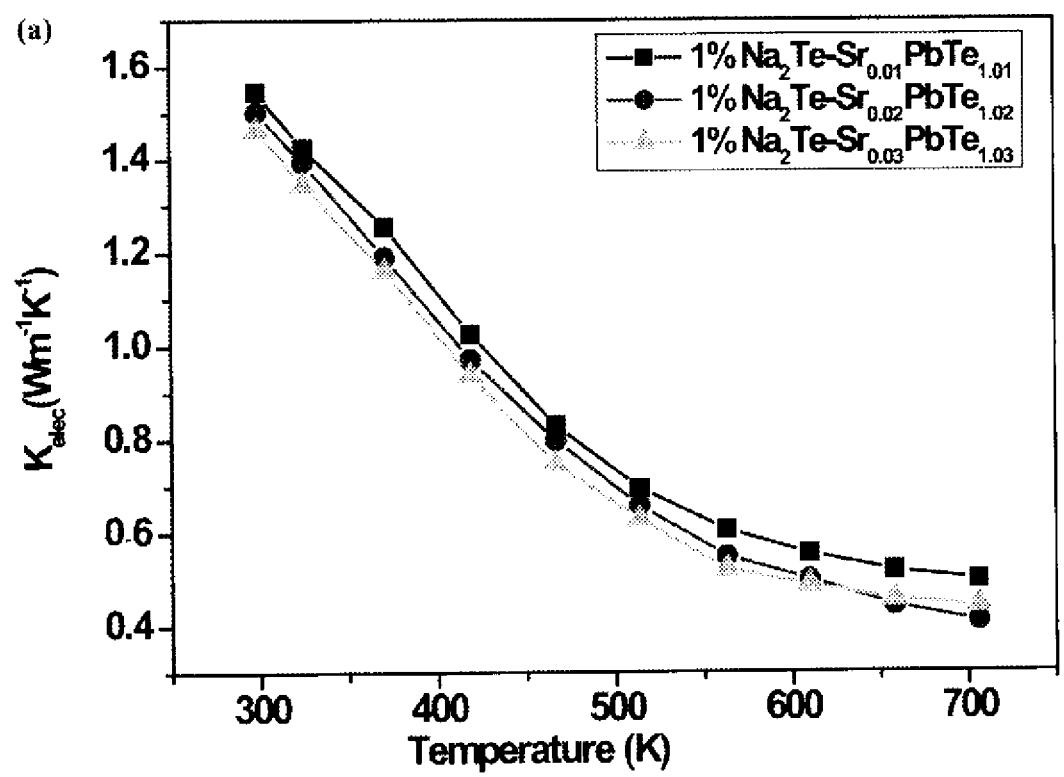

What is claimed is:

1. A composite comprising:
   (a) a matrix comprising a chalcogenide having the structure MQ, where M is Ge, Sn or Pb and Q is S, Se or Te; and
   (b) a plurality of inclusions dispersed within the matrix, the inclusions comprising an alkaline earth chalcogenide having the structure AB, where A is an alkaline earth metal element and B is S, Se or Te;
   wherein the inclusions are endotaxially embedded in the matrix such that at least one of the A sublattice or the B sublattice of the alkaline earth chalcogenide is aligned with at least one of the M sublattice or the Q sublattice of the matrix and further wherein the inclusions have an average diameter of no greater than 150 nm; and
   wherein the composite is doped with an n-type or p-type dopant.

2. The composite of claim 1, wherein the inclusions have an average diameter of no greater than 50 nm.

3. The composite of claim 1, wherein the carrier mobility in the composite is equal to or higher than the carrier mobility in the matrix chalcogenide in the absence of the inclusions.

4. The composite of claim 1, wherein the lattice thermal conductivity of the matrix chalcogenide is at least two times larger than that of the composite at a temperature in the range of 289 K to 600 K.

5. The composite of claim 1, wherein the composite is doped with a p-type dopant.

6. The composite of claim 5 having a ZT of at least 1.2 at 620 K.

7. The composite of claim 1, wherein MQ is PbTe.

8. The composite of claim 7, wherein AB is CaTe.

9. A composite comprising:
   (a) a matrix comprising a chalcogenide having the structure MQ, where M is Pb and Q is Te, such that MQ is PbTe; and
   (b) a plurality of inclusions dispersed within the matrix, the inclusions comprising an alkaline earth chalcogenide having the structure AB, where A is Sr and B is Te, such that AB is SrTe;

wherein the inclusions are endotaxially embedded in the matrix such that at least one of the A sublattice or the B sublattice of the alkaline earth chalcogenide is aligned with at least one of the M sublattice or the Q sublattice of the matrix and further wherein the inclusions have an average diameter of no greater than 150 nm.

10. The composite of claim 7, wherein AB is BaTe.

11. The composite of claim 5, wherein MQ is PbTe, AB is CaTe or SrTe, and the p-type dopant comprises Na, the composite having a ZT of at least 1 at 620 K.

12. A method of making the composite of claim 1, the method comprising mixing the elements M, Q, A and B in a stoichiometric ratio corresponding to the composite, heating the mixture to form a melt, and allowing the melt to cool, whereby alkaline earth chalcogenides precipitate out of the melt to form the inclusions dispersed in the matrix.

13. The composite of claim 1 having a dopant concentration in the range from 0.01 to 3 mol. %.

14. The composite of claim 9 doped with a p-type dopant.

15. The composite of claim 14 having a Sr content in the range from 1 to 3 mol. %.

16. The composite of claim 15 having a p-type dopant concentration in the range from 0.01 to 3 mol. %.

17. The composite of claim 16 having a ZT of at least 1.7 in the temperature range from 600 to 800 K.

18. The composite of claim 17, wherein the p-type dopant is Na.

19. The composite of claim 8 doped with a p-type dopant.

20. The composite of claim 19 having a p-type dopant concentration in the range from 0.01 to 3 mol. %.

21. The composite of claim 20 having a ZT of at least 1.4 at a temperature of 800 K.

* * * * *

UNITED STATES PATENT AND TRADEMARK OFFICE
CERTIFICATE OF CORRECTION

PATENT NO. : 8,778,214 B2
APPLICATION NO. : 12/882580
DATED : July 15, 2014
INVENTOR(S) : Mercouri G. Kanatzidis et al.

It is certified that error appears in the above-identified patent and that said Letters Patent is hereby corrected as shown below:

ON THE TITLE PAGE, Item (54) and IN THE SPECIFICATION

In the title,

Delete "THERMOELECTRICS COMPOSITIONS COMPRISING NANOSCALE INCLUSIONS IN A CHALCOGENIDE MATRIX" and replace with --THERMOELECTRIC COMPOSITIONS COMPRISING NANOSCALE INCLUSIONS IN A CHALCOGENIDE MATRIX--

IN THE DRAWINGS

Figure 8A:
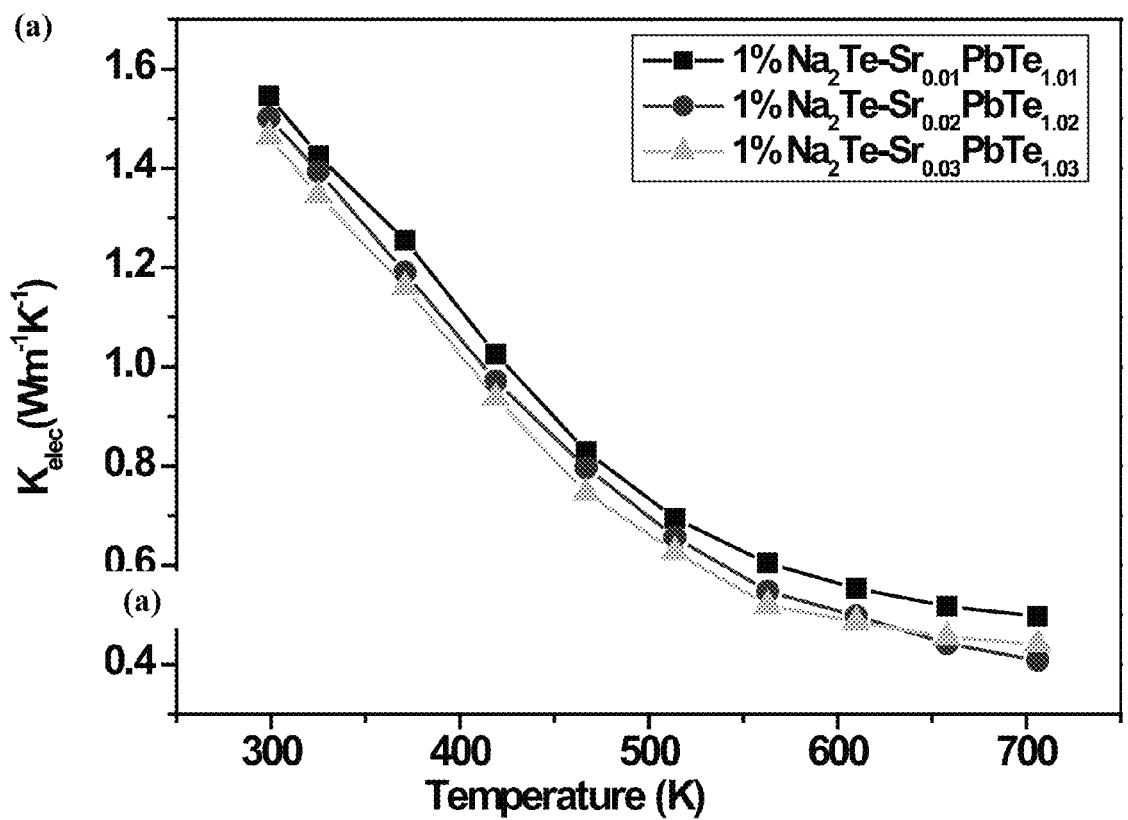
FIG. 8. Temperature dependence of the thermal conductivities from the charge carriers (a) and from the lattice vibrations (b) for $Na_{0.02}Sr_xPbTe_{1.01+x}$.
Figure 8B:
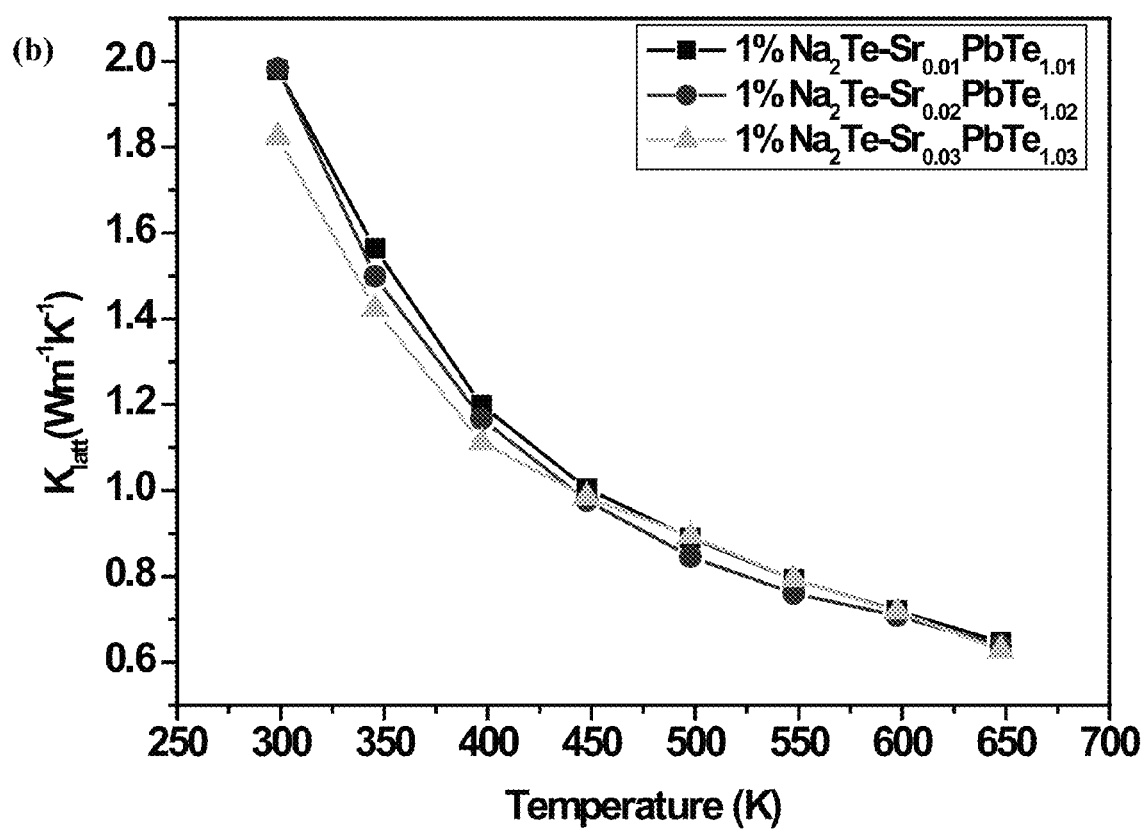

Delete Drawing Sheet 9 of 42 consisting of FIG. 8a and substitute therefore with the attached Drawing Sheet 9 of 42 consisting of corrected FIG. 8a

IN THE SPECIFICATION

Col. 8, Line 15

Delete "(X=0.71073 Å)" and replace with --($\lambda$=0.71073 Å)--

Col. 9, Line 26

Delete "conductivity a of" and replace with --conductivity σ of--

Col. 16, Line 13

Delete "w/cm$^2$K$^2$Ω" and replace with --W/cm$^2$K$^2$Ω--

Col. 16, Line 15

Delete "$\kappa_{lat} - \kappa_{tot} - \kappa_{elec}$" and replace with --$\kappa_{lat} = \kappa_{tot} - \kappa_{elec}$--

Signed and Sealed this
Twenty-seventh Day of October, 2015

Michelle K. Lee
*Director of the United States Patent and Trademark Office*